(12) United States Patent
Lowrey

(10) Patent No.: US 7,978,506 B2
(45) Date of Patent: *Jul. 12, 2011

(54) THIN FILM LOGIC DEVICE AND SYSTEM

(75) Inventor: Tyler Lowrey, Rochester Hills, MI (US)

(73) Assignee: Ovonyx, Inc., Troy, MI (US)

( * ) Notice: Subject to any disclaimer, the term of this patent is extended or adjusted under 35 U.S.C. 154(b) by 606 days.

This patent is subject to a terminal disclaimer.

(21) Appl. No.: 12/157,049

(22) Filed: Jun. 6, 2008

(65) Prior Publication Data

US 2008/0272807 A1    Nov. 6, 2008

Related U.S. Application Data

(63) Continuation-in-part of application No. 11/724,485, filed on Mar. 15, 2007.

(51) Int. Cl.
*G11C 11/00* (2006.01)

(52) U.S. Cl. ............ 365/163; 365/148; 326/52; 326/104

(58) Field of Classification Search ............... 365/148, 365/163; 326/52, 104
See application file for complete search history.

(56) References Cited

U.S. PATENT DOCUMENTS

| | | | | |
|---|---|---|---|---|
| 3,271,591 A * | 9/1966 | Ovshinsky | ............ | 327/500 |
| 3,530,441 A * | 9/1970 | Ovshinsky | ............ | 365/113 |
| 3,590,273 A * | 6/1971 | Jarvis | ............ | 326/97 |
| 3,935,474 A * | 1/1976 | Komarek | ............ | 326/96 |
| 5,166,758 A * | 11/1992 | Ovshinsky et al. | ............ | 257/3 |
| 5,296,716 A * | 3/1994 | Ovshinsky et al. | ............ | 257/3 |
| 5,341,328 A * | 8/1994 | Ovshinsky et al. | ............ | 365/163 |
| 5,359,205 A * | 10/1994 | Ovshinsky | ............ | 257/3 |
| 5,414,271 A * | 5/1995 | Ovshinsky et al. | ............ | 257/3 |
| 5,534,711 A * | 7/1996 | Ovshinsky et al. | ............ | 257/3 |
| 5,534,712 A * | 7/1996 | Ovshinsky et al. | ............ | 257/2 |
| 5,536,947 A * | 7/1996 | Klersy et al. | ............ | 257/3 |
| 5,543,737 A * | 8/1996 | Ovshinsky | ............ | 326/104 |
| 5,596,522 A * | 1/1997 | Ovshinsky et al. | ............ | 365/113 |
| 5,687,112 A * | 11/1997 | Ovshinsky | ............ | 365/163 |
| 5,694,054 A * | 12/1997 | Ovshinsky et al. | ............ | 326/35 |
| 5,694,146 A * | 12/1997 | Ovshinsky et al. | ............ | 345/91 |
| 5,714,768 A * | 2/1998 | Ovshinsky et al. | ............ | 257/40 |
| 5,757,446 A * | 5/1998 | Ovshinsky et al. | ............ | 349/49 |
| 5,825,046 A * | 10/1998 | Czubatyj et al. | ............ | 365/163 |
| 5,912,839 A * | 6/1999 | Ovshinsky et al. | ............ | 365/185.03 |
| 6,087,674 A * | 7/2000 | Ovshinsky et al. | ............ | 257/2 |
| 6,296,716 B1 * | 10/2001 | Haerle et al. | ............ | 134/7 |
| 6,314,014 B1 * | 11/2001 | Lowrey et al. | ............ | 365/100 |
| 6,671,710 B2 * | 12/2003 | Ovshinsky et al. | ............ | 365/163 |
| 6,687,153 B2 * | 2/2004 | Lowrey | ............ | 365/163 |

(Continued)

OTHER PUBLICATIONS

Pirovana et al., "Low-Field Amorphous State Resistance and Threshold Voltage Drift in Chalcogenide Matierals," May 2004, IEEEE Transactions on Electron Devices, vol. 51, No. 5, pp. 714-719.*

(Continued)

*Primary Examiner* — Alexander Sofocleous

(74) *Attorney, Agent, or Firm* — Kevin L. Bray

(57) ABSTRACT

Thin film logic circuits employ thin-film switching devices to execute complementary logic functions. Such logic devices operate, as complementary metal oxide semiconductor (CMOS) logic devices do, in a manner that does not provide a direct conduction path between a system supply and a system return. Complementary logic circuits may employ three-terminal threshold switches as switching elements.

30 Claims, 14 Drawing Sheets

U.S. PATENT DOCUMENTS

| | | | | |
|---|---|---|---|---|
| 6,714,954 | B2* | 3/2004 | Ovshinsky et al. | 708/200 |
| 6,774,387 | B2* | 8/2004 | Maimon | 257/2 |
| 6,795,338 | B2* | 9/2004 | Parkinson et al. | 365/163 |
| 6,859,390 | B2* | 2/2005 | Pashmakov | 365/163 |
| 6,963,893 | B2* | 11/2005 | Ovshinsky et al. | 708/491 |
| 6,967,344 | B2* | 11/2005 | Ovshinsky et al. | 257/2 |
| 6,969,867 | B2* | 11/2005 | Ovshinsky | 257/4 |
| 6,999,953 | B2* | 2/2006 | Ovhsinsky | 706/39 |
| 7,186,998 | B2* | 3/2007 | Ovshinsky et al. | 257/3 |
| 7,839,673 | B2* | 11/2010 | Lowrey | 365/163 |
| 7,859,895 | B2* | 12/2010 | Lowrey | 365/163 |
| 2004/0178401 | A1* | 9/2004 | Ovshinsky et al. | 257/2 |
| 2006/0120136 | A1* | 6/2006 | Dennison et al. | 365/148 |
| 2007/0096071 | A1* | 5/2007 | Kordus et al. | 257/2 |
| 2007/0267623 | A1* | 11/2007 | Ovshinsky | 257/9 |
| 2008/0224734 | A1* | 9/2008 | Lowrey | 326/93 |
| 2009/0303781 | A1* | 12/2009 | Lowrey | 365/163 |
| 2009/0303783 | A1* | 12/2009 | Lowrey | 365/163 |
| 2009/0303784 | A1* | 12/2009 | Lowrey | 365/163 |
| 2009/0307410 | A1* | 12/2009 | Lowrey | 711/101 |

OTHER PUBLICATIONS

Weiss, "Morphing Memory: Superfast Atom Shuffling Inspires Data-Storage Alternatives," Jun. 4, 2005, Science News, vol. 167, No. 23, pp. 363-364. Retrieved from http://www.phschool.com/science/science_news/.*

Ovshinsky, "Reversible Electrical Switching Phenomena in Disordered Structures," Nov. 11, 1968, Physical Review Letters, vol. 21, No. 20, pp. 1450-1455.*

Ovshinsky et al., "Amorphous Semiconductors for Switching, Memory, and Imaging Applications," Feb. 1993, IEEE Transactions on Electron Devices, vol. ED-20, No. 2, pp. 91-105.*

Cheng, "Comprehensive Study on Designing Memory BIST: Algorithms, Implementations and Trade-offs," dated Dec. 16, 2002. 34 pages.*

* cited by examiner

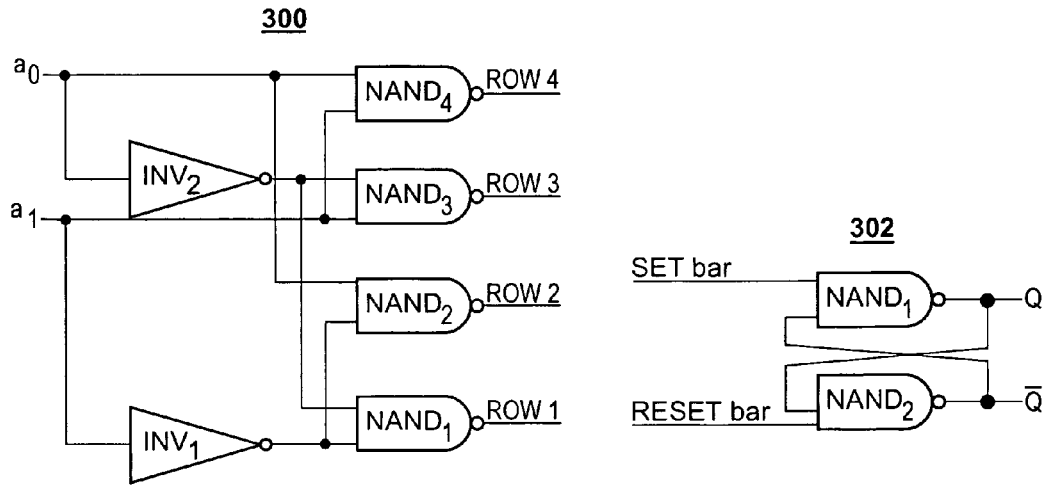
FIG - 3A
FIG - 3B
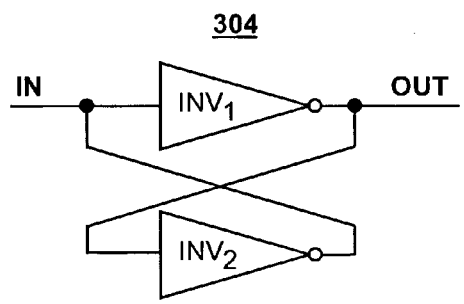
FIG - 3C
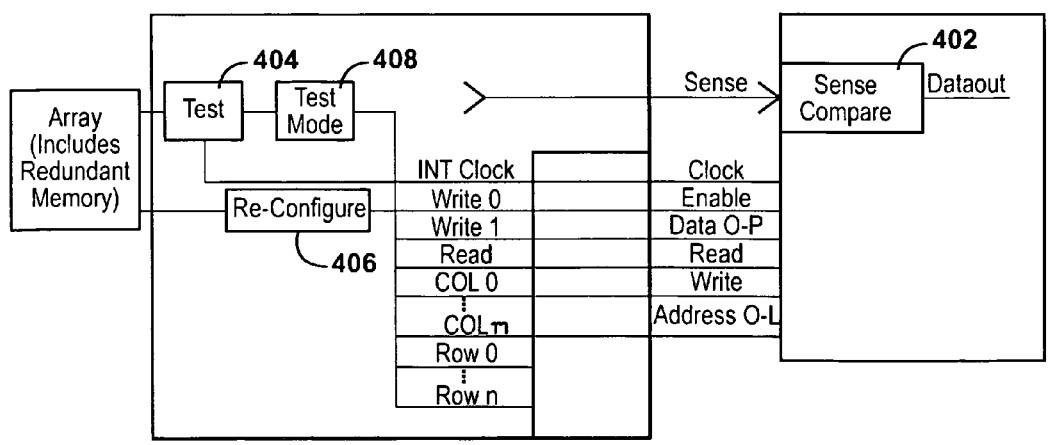
FIG - 4

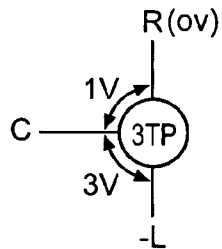
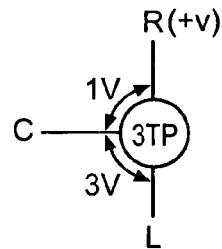
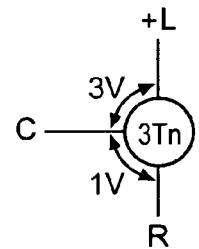
FIG - 12A  FIG - 12B  FIG - 12C
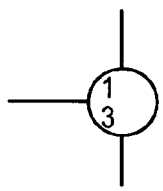
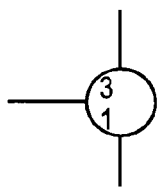
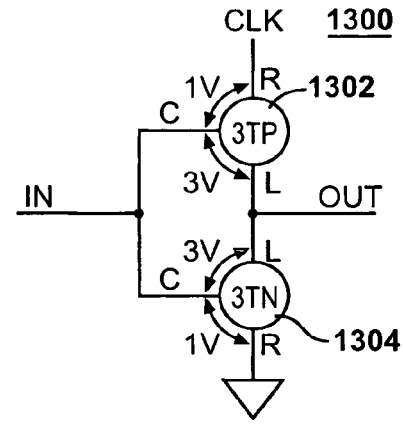
FIG - 12D  FIG - 12E  FIG - 13
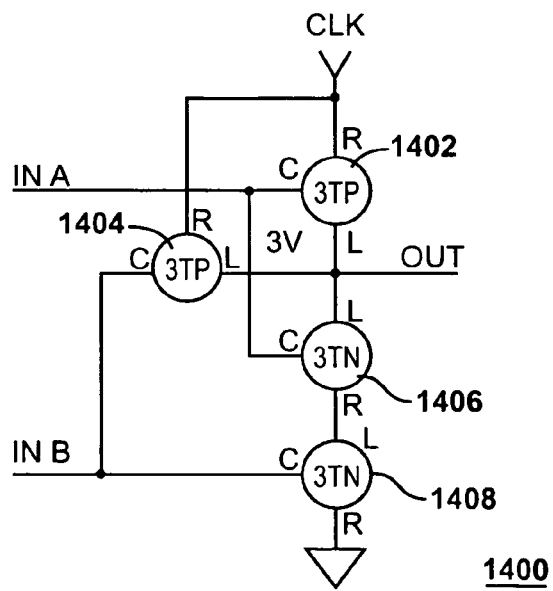
FIG - 14

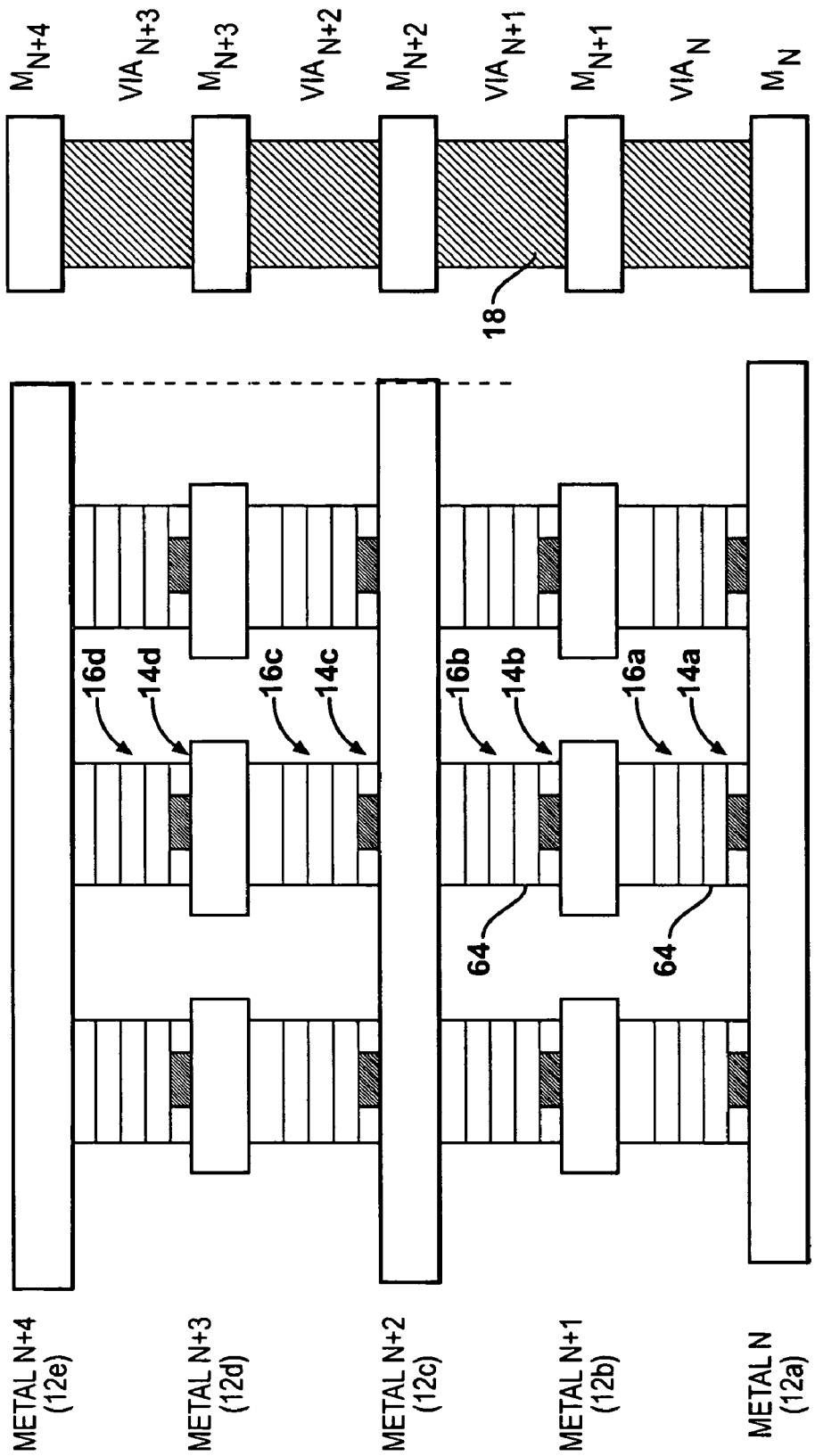

THIN FILM LOGIC DEVICE AND SYSTEM

CROSS-REFERENCE TO RELATED APPLICATIONS

This application is a continuation in part of U.S. patent application Ser. No. 11/724,485, entitled, "MULTI-TERMINAL CHALCOGENIDE LOGIC CIRCUITS," filed, Mar. 15, 2007, having Tyler Lowrey as inventor, which is hereby incorporated by reference in its entirety.

FIELD OF INVENTION

This invention relates to electronic memory circuits.

BACKGROUND OF THE INVENTION

As electronic memories approach limits beyond which they will no longer be able to produce the density/cost/performance improvements so famously set forth in Moore's law, a host of memory technologies are being investigated as potential replacements for conventional silicon complementary metal oxide semiconductor (CMOS) integrated circuit memories. Among the technologies being investigated are phase change memory technologies. Phase-change memory arrays are based upon memory elements that switch among two material phases, or gradations thereof, to exhibit corresponding distinct electrical characteristics. Alloys of elements of group VI of the periodic table, such as Te, S or Se, referred to as chalcogenides or chalcogenic materials, can be used advantageously in phase change memory cells. In the chalcogenides, the resistivity varies by two or more orders of magnitude when the material passes from the amorphous (more resistive) phase to the crystalline (more conductive) phase, and vice versa. Further, the resistivity of the chalcogenide materials generally depend on the temperature with the amorphous state generally being more temperature dependent that the crystalline state.

A chalcogenide memory device may utilize the wide range of resistance values available for the material as the basis of memory operation. Each resistance value corresponds to a distinct structural state of the chalcogenide material and one or more of the states can be selected and used to define operation memory states. Chalcogenide materials exhibit a crystalline state, or phase, as well as an amorphous state, or phase. Different structural states of a chalcogenide material differ with respect to the relative proportions of crystalline and amorphous phase in a given volume or region of chalcogenide material. The range of resistance values is generally bounded by a set state and a reset state of the chalcogenide material. By convention, the set state is a low resistance structural state whose electrical properties are primarily controlled by the crystalline portion of the chalcogenide material and the reset state is a high resistance structural state whose electrical properties are primarily controlled by the amorphous portion of the chalcogenide material.

Phase change may be induced by increasing the temperature locally. Below 150° C., both of the phases are stable. Above 200° C., there is a rapid nucleation of the crystallites and, if the material is kept at the crystallization temperature for a sufficiently long time, it undergoes a phase change and becomes crystalline. To bring the chalcogenide back to the amorphous state it is necessary to raise the temperature above the melting temperature (approximately 600° C.) and then cool it off rapidly, i.e. quench. From the electrical standpoint, it is possible to reach the crystallization and melting temperatures by causing a current to flow through a crystalline resistive element that heats the chalcogenic material by the Joule effect.

Each memory state of a chalcogenide memory material corresponds to a distinct range of resistance values and each memory resistance value range signifies unique informational content. Operationally, the chalcogenide material can be programmed into a particular memory state by providing an electric current pulse of an appropriate amplitude and duration to transform the chalcogenide material into the structural state having the desired resistance. By controlling the amount of energy provided to the chalcogenide material, it is possible to control the relative proportions of crystalline and amorphous phase regions within a volume of the material and to thereby control the structural (and corresponding memory) state of the chalcogenide material to store information.

Each memory state can be programmed by providing the current pulse characteristics of the state and each state can be identified, or "read", in a non-destructive fashion by measuring the resistance. Programming among the different states is fully reversible and the memory devices can be written and read over a virtually unlimited number of cycles to provide robust and reliable operation. The variable resistance memory functionality of chalcogenide materials is currently being exploited in the OUM (Ovonic Universal (or Unified) Memory) devices that are beginning to appear on the market. Basic principles and operation of OUM type devices are presented, for example, in U.S. Pat. Nos. 6,859,390; 6,774, 387; 6,687,153; and 6,314,014; the disclosures of which are incorporated by reference herein, as well as in several journal articles including, "Low Field Amorphous State Resistance and Threshold Voltage Drift in Chalcogenide Materials," published in EE transactions on Electron Devices, vol. 51, p. 714-719 (2004) by Pirovana et al.; and "Morphing Memory", published in Science News, vol. 167, no. 23, p. 363-364 (2005) by Weiss.

The behavior (including switching, memory, and accumulation) and chemical compositions of chalcogenide materials have been described, for example, in the following U.S. Pat. Nos. 6,671,710; 6,714,954; 6,087,674; 5,166,758; 5,296,716; 5,536,947; 5,596,522; 5,825,046; 5,687,112; 5,912,839; and 3,530,441, the disclosures of which are hereby incorporated by reference. These references present proposed mechanisms that govern the behavior of chalcogenide materials. The references also describe the structural transformations from the crystalline state to the amorphous state (and vice versa) via a series of partially crystalline states in which the relative proportions of crystalline and amorphous regions vary during the operation of electrical and optical programming of chalcogenide materials.

A wide range of chalcogenide compositions has been investigated in an effort to optimize the performance characteristics of chalcogenic devices. Chalcogenide materials generally include a chalcogen element and one or more chemical or structural modifying elements. The chalcogen element (e.g. Te, Se, S) is selected from column VI of the periodic table and the modifying elements may be selected, for example, from column III (e.g. Ga, Al, In), column IV (e.g. Si, Ge, Sn), or column V (e.g. P, As, Sb) of the periodic table. The role of modifying elements includes providing points of branching or cross-linking between chains comprising the chalcogen element. Column IV modifiers can function as tetracoordinate modifiers that include two coordinate positions within a chalcogenide chain and two coordinate positions that permit branching or crosslinking away from the chalcogenide chain. Column III and V modifiers can function as tricoordinate modifiers that include two coordinate positions within a chalcogenide chain and one coordinate position that permits branching or crosslinking away from the chalcogenide chain. Embodiments in accordance with the principles of the present invention may include binary, ternary, quaternary, and higher order chalcogenide alloys. Examples of chalcogenide materials are described in U.S. Pat. Nos. 5,166,758, 5,296,716, 5,414,271, 5,359,205, 5,341,328, 5,536,947, 5,534,712, 5,687,112, and 5,825,046 the disclosures of which are all incorporated by reference herein. Chalcogenide materials may be deposited with a reactive sputtering process with gasses such as N2 or O2: forming a chalcogenide nitride, or oxide, for example and chalcogenide may be modified by an ion implantation or other process.

Early work in chalcogenide devices demonstrated electrical switching behavior in which switching from an "off" resistive state to an "on" conductive state was induced upon application of a voltage at or above the threshold voltage of the active chalcogenide material. This effect is the basis of the Ovonic Threshold Switch (OTS) and remains an important practical feature of chalcogenide materials. The OTS provides highly reproducible switching at ultrafast switching speeds. Basic principles and operational features of the OTS are presented, for example, in U.S. Pat. Nos. 3,271,591; 5,543,737; 5,694,146; and 5,757,446; the disclosures of which are hereby incorporated by reference, as well as in several journal articles including "Reversible Electrical Switching Phenomena in Disordered Structures," Physical Review Letters, vol. 21, p. 1450-1453 (1969) by S. R. Ovshinsky; "Amorphous Semiconductors for Switching, Memory, and Imaging Applications," IEEE Transactions on Electron Devices, vol. ED-20, p. 91-105 (1973) by S. R. Ovshinsky and H. Fritzsche; the disclosures of which are hereby incorporated by reference. Three-terminal OTS devices are disclosed, for example, in U.S. Pat. Nos. 6,969,867 and 6,967,344; the disclosures of which are hereby incorporated by reference.

Although highly efficient and cost effective, process methods and device structures that reduce the cost of phase change memories would be highly desirable.

SUMMARY OF THE INVENTION

Thin film logic circuits in accordance with the principles of the present invention employ thin-film switching devices to execute complementary logic functions. By complementary logic, we mean logic devices that operate, as complementary metal oxide semiconductor (CMOS) logic devices do, in a manner that does not provide a direct conduction path between a system supply and a system return. Using this approach, power consumption is greatly reduced when compared to non-complementary thin film logic systems. To a first approximation, the only power required to operate such a circuit is the amount required to charge and discharge the capacitance of terminals and interconnect during switching; there is no static power consumption (disregarding leakage currents). In an illustrative embodiment, complementary logic circuits in accordance with the principles of the present invention employ three-terminal threshold switches as switching elements.

Thin film logic devices in accordance with the principles of the present invention may employ asymmetric-threshold three-terminal electronic switching devices referred to herein as 3TP and 3TN devices, depending upon their circuit configuration (that is, a 3TP device is connected in a manner analogous to a p-channel MOSFET; a 3TN device is connected in a manner analogous to an n-channel MOSFET).

Logic circuits in accordance with the principles of the present invention include inverters (NOT), AND, OR, NAND, NOR, XOR, and XNOR gates. Any logic function may be built using a subset of these basic gates (a complete set of logic functions may be produced, for example, using only NAND gates). In illustrative embodiments, such gates are combined to form a flip-flop, a latch, a memory decoder, a memory controller, and a microcontroller. Logic gates in accordance with the principles of the present invention may also be employed in embedded devices, such as devices that include both thin-film memory and thin film logic in a single standalone circuit.

Asymmetric-threshold three terminal electronic switching devices in accordance with the principles of the present invention may be employed in the peripheral/access circuitry of a memory array, such as a phase change memory array. In an illustrative embodiment, asymmetric-threshold three-terminal electronic switching devices are employed as memory cell access devices in such a memory. Additionally, the peripheral circuitry employs such devices to implement decoding and input/output circuitry.

In an illustrative "embedded" embodiment, thin-film logic in accordance with the principles of the present invention is configured to provide the decoding for a thin film memory, such as a programmable resistance memory, for example. A thin film logic circuit in accordance with the principles of the present invention may be particularly suitable for operation in a variety of electronic devices, including cellular telephones, radio frequency identification devices (RFID), computers (portable and otherwise), solid state drives (SSD), location devices (e.g., global positioning system (GPS) devices, particularly those that store and update location-specific information), and handheld electronic devices, including personal digital assistants (PDAs), and entertainment devices, such as MP3 players, for example.

BRIEF DESCRIPTION OF THE DRAWINGS

FIGS. 3A, 3B, and 3C are logic diagrams of thin film decoders, flip-flops, and latches such as may be employed by a standalone thin film memory in accordance with the principles of the present invention;

FIG. 4 is a conceptual block diagram of a memory controller and standalone thin film memory in accordance with the principles of the present invention;

FIGS. 12A, 12B, 12C, 12D, and 12E are schematic representations of three terminal OTS devices in accordance with the principles of the present invention;

FIG. 13 is a schematic diagram of a thin film inverter in accordance with the principles of the present invention;

FIG. 14 is a schematic diagram of a thin film NAND gate in accordance with the principles of the present invention;

DETAILED DESCRIPTION

Figure 1:
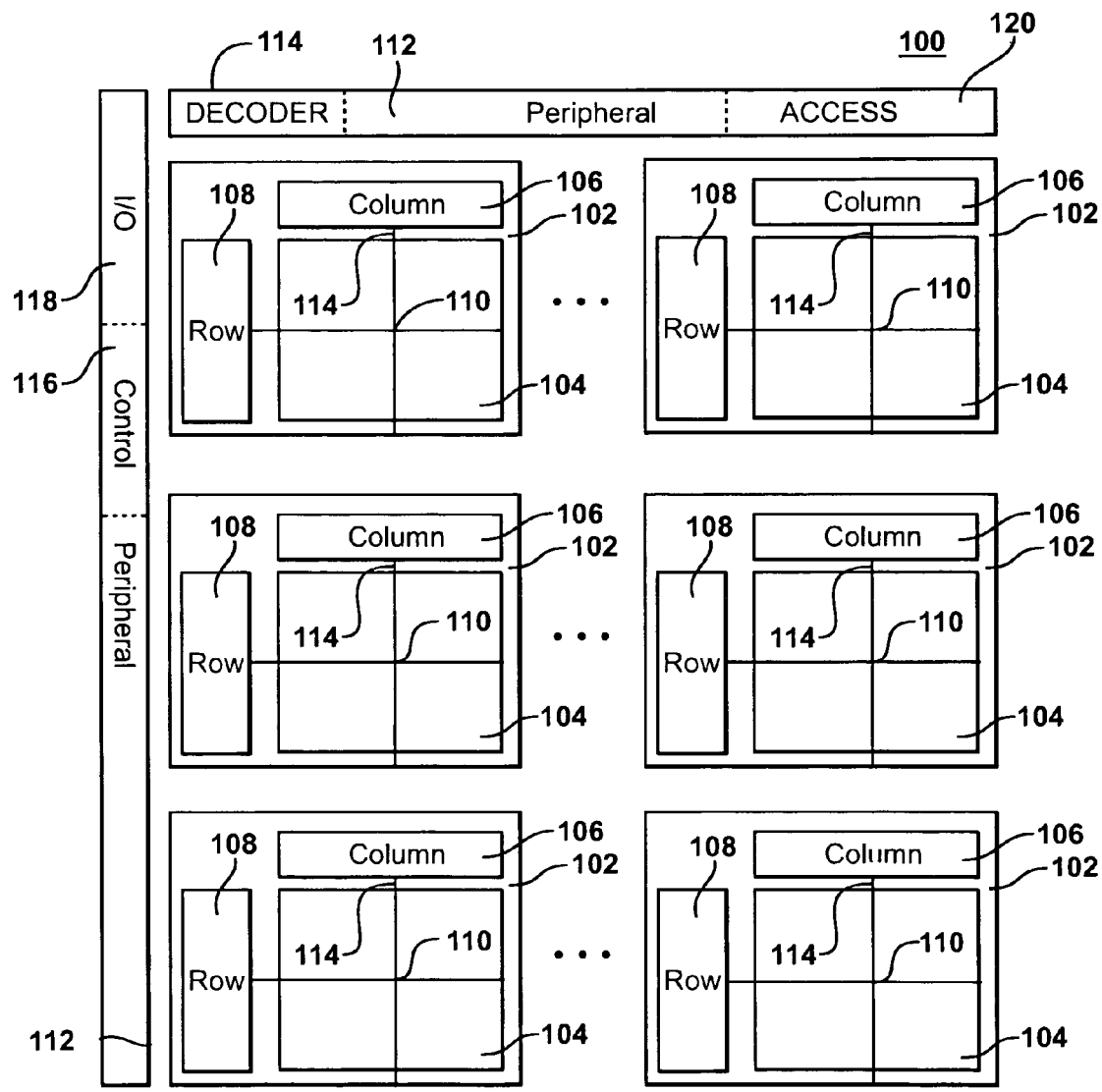
FIG. 1 is a conceptual block diagram of a standalone thin film memory in accordance with the principles of the present invention.

Although this invention will be described in terms of certain preferred embodiments, other embodiments that are apparent to those of ordinary skill in the art, including embodiments that do not provide all of the benefits and features set forth herein, are also within the scope of this invention. Various structural, logical, process step, chemical, and electrical changes may be made without departing from the spirit or scope of the invention. Polarities and types of devices and supplies may be substituted in a manner that would be apparent to one of reasonable skill in the art. Although circuits are generally described in terms of three terminal ovonic threshold switches (3T OTS), other thin-film switching devices, such as amorphous or polycrystalline transistors may be substituted for the 3T OTS devices in some embodiments. Accordingly, the scope of the invention is defined only by reference to the appended claims.

In an illustrative embodiment, a memory in accordance with the principles the present invention couples thin-film peripheral circuitry with thin-film memory to yield a standalone circuit that includes memory and peripheral circuitry, all of which is rendered using thin film processes and structure. That is, a standalone memory in accordance with the principles of the present invention is produced by one or more thin film processes, such as sputtering or deposition and the resulting structure of a standalone memory in accordance with the principles of the present invention includes thin film layers of polycrystalline and/or amorphous materials formed into thin film memory cells and associated peripheral circuitry without any single-crystal structures or devices. Thus the thin film standalone circuits of the present invention do not require bulk single crystal Silicon or other elemental or compound single crystal materials. Additionally, single crystal devices such as diodes, MOS transistors, BJT transistors, and SCR devices are not required to co-exist on the same substrate with the thin film standalone circuits. All memory, logic, and other functions on a given chip are thus performed by thin film devices formed by sequential deposition and patterning of thin film materials. Example thin film materials are chalcogenide materials (e.g. GeSbTe 225), interconnect conductive materials (e.g. Al, Cu, W), electrode materials (e.g. C, TiAlN, TiSiN, TiN), and insulators (e.g. SiO2, SiNx, Al2O3), and OTS material AsGeInSiTe 35/7/0.25/18/40.

For the purposes of this discussion, a "standalone circuit" refers to an integrated electronic circuit that is configured to accept at least one input from, and provide at least one output to, at least one other electronic device. Each standalone circuit typically includes input and output structures, such as pads for connection to external circuits and input and output drivers connected to those pads for communication with circuits external to the standalone circuit. Various packaging schemes may be employed with such a standalone circuit, including hybrid packaging, conventional bump bonding, chip-on-board, single-in-line packaging, dual-in-line packaging, for example. Whatever packaging scheme is employed, the standalone circuit includes input and output drivers connected to pads employed for interconnection with other electronic circuits.

The conceptual block diagram of FIG. 1 provides a functional level view of an illustrative standalone thin film memory circuit 100 in accordance with the principles of the present invention. In this illustrative embodiment, a standalone thin film memory circuit 100 includes at least one array of thin-film memory cells arranged as a storage matrix tile 102, along with thin-film peripheral circuitry that, in combination, yields the standalone thin-film memory circuit 100. As described in greater detail in the discussion related to FIG. 2, the thin-film memory cells of the storage matrix 104 may be implemented as, for example, phase change memory cells. In this illustrative embodiment, the memory circuit 100 includes thin film row drivers 108 and column drivers 106 configured to access cells within the storage matrix 104. As described in greater detail in the discussion related to FIG. 2, the row 108 and column 106 drivers may be, for example, three terminal ovonic threshold switches (3T OTS). The three terminals of a 3T OTS device will be referred to herein as "load", "control", and "reference" terminals which, as will be described in greater detail in the discussion related to FIG. 8, generally correspond, in functional terms, respectively, to the drain, gate, and source terminals of a field effect transistor. Thin film row address, column address and data latches may also be included in the peripheral circuitry 112.

Accesses carried out by the thin film row 108 and column 106 drivers include reading from the memory cells of the matrix 104 and writing to the memory cells of the matrix 104. Peripheral circuitry 112 includes thin-film decoding circuitry 114 which accepts address signals and decodes the address signals to determine which of the row 108 and column 106 drivers to activate and, thereby, which of the memory cells within the array 104 to access. Thin film access circuitry 120 including thin film current sources for row 108 and column 106 drivers are described in greater detail in the discussion related to FIG. 2.

In an illustrative embodiment described in greater detail in the discussion related to FIG. 3, the decoding circuitry 114 may be implemented using 3T OTS devices. Peripheral circuitry 112 may include control circuitry 116 that employs 3T OTS logic which accepts READ, WRITE, and CLOCK signals and develops control signals for the standalone thin film memory 100. The control signals developed for the memory 100 may include data direction control (e.g., "read from" or "write to" the storage matrix tile 102) and multi-phase clock signals, for example. In an illustrative embodiment the peripheral circuitry includes 3T OTS input/output circuitry 118. The input/output circuitry 118 includes 3T OTS circuitry configured to accept data for writing to and to drive data read from the storage matrix tile 102. Thin film input/output 118 and control circuitry 116 are described in greater detail in the discussion related to FIG. 4.

The 3T OTS devices are an example of asymmetric-threshold three-terminal electronic switching devices in accordance with the principles of the present invention, which include three terminals coupled to a threshold-switching material. A signal applied across first and second terminals affects an electrical characteristic between the second and third electrodes to a greater extent than the same signal applied across the first and third electrodes. The affected electrical characteristic may be a threshold voltage or conductivity, for example.

An asymmetric-threshold three-terminal switching device in accordance with the principles of the present invention may include ovonic threshold switching material coupled to three terminals. To produce the desired threshold modulation asymmetry a greater thickness of threshold switching material may be positioned between the control terminal and load terminal than between the control terminal and reference terminal.

Such asymmetry may be achieved alternatively or in combination with differences in the composition of the threshold switching material between the control/reference and control/load terminal pairs. Not wishing to be bound by theory, it is believed that filament formation in threshold switching material is enhanced by the use of materials that exhibit lower binding energies in their valence electrons. In an illustrative embodiment the threshold material between control and reference terminals may be tellurium-rich, for example, to reduce the modulation threshold voltage for the control/reference terminal pair. The threshold material between control and load terminals may be sulfur- or selenium-rich to raise the modulation-threshold voltage for the control/load terminal pair.

Figure 2:
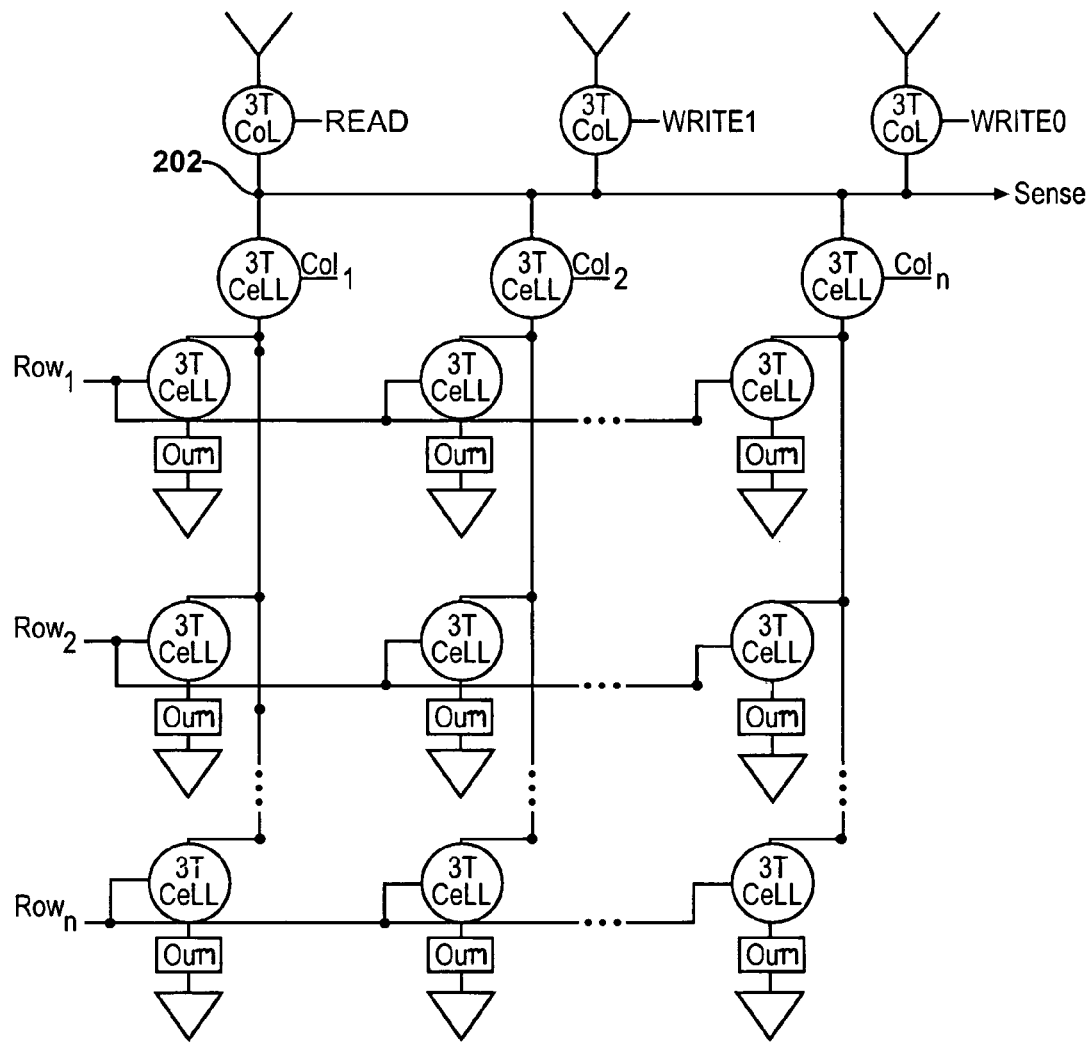
FIG. 2 is a more detailed conceptual block diagram of a standalone thin film memory in accordance with the principles of the present invention.

The conceptual block diagram of FIG. 2 provides a more detailed view of a portion of a standalone thin-film memory in accordance with the principles of the present invention. The illustrative memory segment 200 includes access current sources labeled READ, WRITE0, and WRITE1, all of which are implemented with thin film devices. Although the current sources may be implemented using thin-film transistors, such as polycrystalline or amorphous transistors; 3T OTS devices, labeled 3T CUR, are employed in this illustrative embodiment.

In this illustrative embodiment the load terminals of 3T CUR devices are coupled to a positive supply source, control signals READ, WRITE0, and WRITE1 are directed to their respective control terminals and all their reference terminals are coupled to a common node 202. Each of the current supply devices 3T CUR is biased to provide a current pulse appropriate for its selected operation to the common node 202. That is, when one of the control signals READ, WRITE0, or WRITE1 is activated, the corresponding 3T OTS directs, respectively, a READ, WRITE0, or WRITE1 current pulse to the common node 202.

In this illustrative embodiment, each memory cell includes a phase change memory, labeled OUM, which is coupled to a return path on one side, as indicated by the connection to "ground" in the figure. The other side of each phase change memory is coupled to a reference terminal of a 3T OTS labeled 3T CELL. The control terminals of the 3T CELL devices are coupled to a row access signal so that the control terminals of all 3T OTS devices in a row are coupled to the same row access signal (e.g. ROW1, ROW2, . . . ROWn). Similarly the load terminals of all 3T OTS devices in a given column are coupled to the same column access signal (e.g., COL1, COL2, . . . COL3) through 3T OTS devices labeled 3T COL. Each memory device OUM may thereby be accessed individually by asserting a corresponding row/column pair of access devices. For example, cell n,m may be accessed by asserting the row n signal (coupled to the control terminal of 3T OTS n,m) and the column m signal (coupled to the load terminal of 3T OTS n,m through the reference terminal of 3T COL device m).

In this illustrative embodiment, the load terminals of the 3T COL devices are all coupled to common node 202 through which access currents are directed from READ, WRITE0, and WRITE1 current sources, as previously described. In this way, the column access 3T OTS devices 3T COL operate to "gate" the appropriate access current to a selected column of devices and the row access 3T OTS devices operate to provide a return path for the current pulse through a selected one of the OUM memory devices coupled to the "gating" column access device 3T OTS. In the case of a WRITE access, the current pulse operates to program a selected device to a desired memory state (although only two states, o and 1, are illustrated, multiple states are contemplated within the scope of the invention). In the case of a READ access, the current pulse operates to establish a voltage across a selected OUM device, which is sensed through the low impedance path of the selected column access device 3T COL at the column node 202. The READ voltage appearing at the common node 202 may be sensed, as indicated by the arrow labeled SENSE, by a sense amplifier (not shown) and converted to a digital data value by one or more comparators (not shown), for example. As described in greater detail in the discussion related to FIG. 4, the analog sense value may be sent "off-chip" for digitization. Additionally, a standalone thin-film memory in accordance with the principles of the present invention may include circuitry configured to receive one or more reference voltages or current pulses from "off-chip." Such reference voltages or currents may be employed, for example, in the generation of access currents used to write to or read from OUM devices within the memory segment 200. In an illustrative embodiment an external memory controller provides current pulses used to access standalone thin film memories in accordance with the principles of the present invention. Providing current pulses in this manner ensures that the 3T OTS devices used as access devices turn off after they've been used in an access operation.

The conceptual block diagrams of FIGS. 3A, 3B, and 3C illustrates the basic organization of a thin film decoder 300, a flip-flop 302, and inverting latch 304 in accordance with the principles of the present invention. Such a decoder may be included in the peripheral circuitry 112 of FIG. 1 to accept address signals and to provide row and column drive signals to row drivers 108 and column drivers 106, and, more particularly, to activate row 3T CELL and column 3T COL 3T OTS drivers described in the discussion related to FIG. 2. The disclosed thin-film logic functions may be implemented using 3T OTS devices, as described in greater detail in the discussion related to FIGS. 7-14.

In this illustrative embodiment, the decoder 300 receives address lines A0 and A1 and, from the address signals, derives row access signals ROW 1, ROW2, ROW3, and ROW4. Address line A0 is coupled to a first input of two-input NAND gate NAND4, to the input of an inverter INV2, and to a first input of NAND gate NAND2. The inverted address A0 input (output of inverter INV2) is connected to a first input of NAND gate NAND3 and a first input of NAND gate NAND1. Address input A1 is connected to second inputs of NAND gates NAND3 and NAND4, and to the input of inverter INV1. The inverted address A1 input (output of inverter INV1) is connected to the second inputs of NAND gates NAND1 and NAND2.

Increasing address line signal values provide positive outputs and incrementing row line outputs. That is; for address line A0, A1 value 0,0, the Row1 line is asserted (brought low), for address line A0, A1 value 0,1, the Row2 line is asserted, for address line A0, A1 value 1,0, the Row3 line is asserted, and for address line A0, A1 value 1,1, the Row4 line is asserted. A decoder 300 in accordance with the principles of the invention may be extended to any number of address inputs and row selection outputs. Additionally, a decoder 300 in accordance with the principles of the present invention may also be used to decode addresses for column selection outputs.

The flip-flop 302 of FIG. 3B employs two cross-coupled thin film NAND gates, NAND1 and NAND2, such as described in greater detail in the discussion related to FIGS. 7-14. Gate NAND1 receives a SETbar input at one of its input terminals and the output of gate NAND2 at its other input terminal. Gate NAND2 receives a RESETbar input at one of its input terminals and the output of NAND1 at its other input terminal. The outputs of gates NAND1 and NAND2 are Q and Qbar. Thin film flip-flops such as this may be extended to any desirable width and used, for example to latch row and column addresses into row and column decoders, for example.

The inverter latch 304 of FIG. 3C includes two cross-coupled inverters, INV1 and INV2. In an illustrative embodiment, each of the inverters, INV1 and INV2, is a three-terminal OTS-based inverter, such as the inverter described in greater detail in the discussion related to FIG. 13. In operation, a logic "1" input generates a logic "0" output. The logic "0" output is fed to the input of INV2, which generates a logic "1" output. The logic "1" output of INV2 is fed back to the input of INV1, which reinforces the original logic "1" input, thereby creating a stable, latching circuit. If the input value is changed to a logic "0," the output of inverter INV1 changes to a logic "1," which propagates to the input of inverter INV2. The logic "1" at the input of inverter INV2 generates a logic "0" which is fed back to the input, IN, of inverter INV1, another stable state for the latch 304. A plurality of latches, such as latch 304 may be combined to create a latch of a desired width: one the width of a data (or address) path, for example. As described in greater detail in the discussion related to FIG. 6, such latches may be used to store test values and/or test modes within a standalone thin film memory in accordance with the principles of the present invention.

FIG. 4 is a conceptual block diagram of a thin film input/output and control (I/O) interface 400 such as may be employed by a standalone thin film memory in accordance with the principles of the present invention. In this illustrative embodiment a sense signal SENSE is sent "off-chip" to a sense and compare circuit located on a chip other than the standalone thin film memory. The sense and compare circuit 402 accepts the SENSE signal and converts it from an analog signal to a digital signal, thereby developing a digital data output signal(s) for a memory in accordance with the principles of the present invention. The sense and compare circuit 402 may be included, for example, in a memory controller circuit, such as is described in greater detail in the discussion related to FIG. 6.

The SENSE signal, which is indicative of an accessed memory cell's programmed level (manifested, for example, as a voltage level for a cell that exhibits different values of resistance according to its programmed level and to which a current source is delivered for sensing), may be taken from a node, such as node 202 of FIG. 2, "directly atop" an array's column line. In an illustrative embodiment, with a 3T OTS column driver turned "ON" in order to access a cell and a current supplied to an OUM cell by a 3T OTS activated by a READ signal, the voltage at node 202, which is also the SENSE voltage, is approximately the product of the current through the OUM multiplied by the resistance of the OUM plus an offset voltage attributable to the 3T OTS column driver and 3T Cell access device.

Data lines DATA0-DATAP, address lines ADDRESS0-ADDRESSL, and READ and WRITE control signals are received by the I/O circuit 400 and converted to WRITE0, WRITE1, READ, COL0-COLm, and ROW0-ROWn signals. The WRITE0, WRITE1, READ, COL0-COLm, and ROW0-ROWn signal functions have been described in the discussion related to FIG. 2. Although only two-level storage, corresponding to WRITE0 and WRITE1, is employed in this illustrative embodiment, a thin film memory in accordance with the principle of the present invention may employ a scheme whereby each memory cell within a thin film memory array is capable of taking on any one of more than two prescribed levels (resistance or voltage levels, for example), corresponding to a data content of more than one bit per cell.

The I/O circuit 400 also receives a clock input from which it develops internal timing and control signals. In an illustrative embodiment, the I/O circuit develops a multi-phase internal clock signal, labeled INT CLOCK, from a received single-phase system clock. A multi-phase clock and its operation in a thin-film memory in accordance with the principles of the present invention will be described in greater detail in the discussion related to FIGS. 7-14. The internal clock INT CLOCK may also include one or more signals that control the latching of data or intermediate results, for example. A control input ENABLE may be employed by external circuitry to enable the thin film memory in a conventional fashion, for example, to enable the phase change memory after a power-on-reset sequence has been completed.

The I/O circuit 400 may also include test mode support that may operate in conjunction with a memory controller to test operation of the standalone thin film memory. Such testing may include built in self tests. Built in self tests are known and described, for example, in "COMPREHENSIVE STUDY ON DESIGNING MEMORY BIST: ALGORITHMS, IMPLEMENTATIONS AND TRADE-OFFS," by Allen C. Cheng, Department of Electrical Engineering and Computer Science, The University of Mich., which is hereby incorporated by reference.

In accordance with the principles of the present invention, the I/O circuit 400, located on a standalone thin film memory 100, may include circuitry that allows a standalone thin film memory 100 in accordance with the principles of the present invention to off-load functionality to external circuitry, such as an external controller, for example. In an illustrative embodiment, the I/O circuit 400 includes a test register 404, a reconfiguration register 406, and a test mode register 408. A standalone thin film memory 100 in accordance with the principles of the present invention may also include test pads that permit external circuits to probe and exercise components of the memory 100. Such circuitry allows a standalone thin film memory in accordance with the principles of the present invention to be configured for operation with an external controller. For example, the test register 404 may be configured to receive input from an external device, such as patterns that may be used to "exercise" memory elements within the memory array and to thereby uncover faulty elements. Results of the exercising/testing process may be evaluated in an external circuit, such as a memory controller in accordance with the principles of the present invention that is configured for operation with standalone thin-film memories in accordance with the principles of the present invention. The reconfiguration register 406 may be devised to operate in conjunction with an external controller to reconfigure portions of the memory array in response to test results. That is, for example, an external controller may identify a fault within a segment of the memory array 100, in response, provide memory mapping information to the reconfiguration register 406 that allows the reconfiguration register to map redundant memory within the memory array 100 into the "active" memory-mapped space of the memory 100 and to map the faulty memory segment out of the active memory-mapped space.

In accordance with the principles of the present invention, a test mode register 408 includes test mode instructions that may be used by the memory 100 to implement one or more test modes. For example, a standalone thin film memory 100 may cycle through memory locations using a nested do-loop of column, then row (or, row then column) addresses to implement a memory test. In accordance with the principles of the present invention, an all-thin-film counter, composed of thin film logic circuits such as the inverters, flip-flops, and latches described in the discussion related to FIGS. 3A through 3C, may be used to increment the row and column addresses employed within the nested do loop. In this manner, an external controller may initiate a memory test without being burdened with the task of updating addresses and test patterns to cells within the memory 100. Test patterns employed by the memory 100 may include: "all 1s," "all 0s," checkerboard, and checkerboard complement, for example, and a test code stored within the test mode register 408 may determine which of the test patterns to employ.

The on-chip address-generation circuitry may also be employed to implement a self-refresh mode, whereby the memory 100 cycles through a do loop of column, then row (or row, then column) addresses and reads then rewrites (with the same data) the active cells within the array 100. Such a self-refreshing process may be initiated, by a memory controller, for example, at strategic times, such as during system power up or power down. An all thin film memory 100 in accordance with the principles of the present invention may include input protection circuits, high speed data interface circuits for communications with an external controller, address transition detection circuits for operation with an external controller and user-selectable operating mode detection circuits for operation with an external controller.

Figure 5:
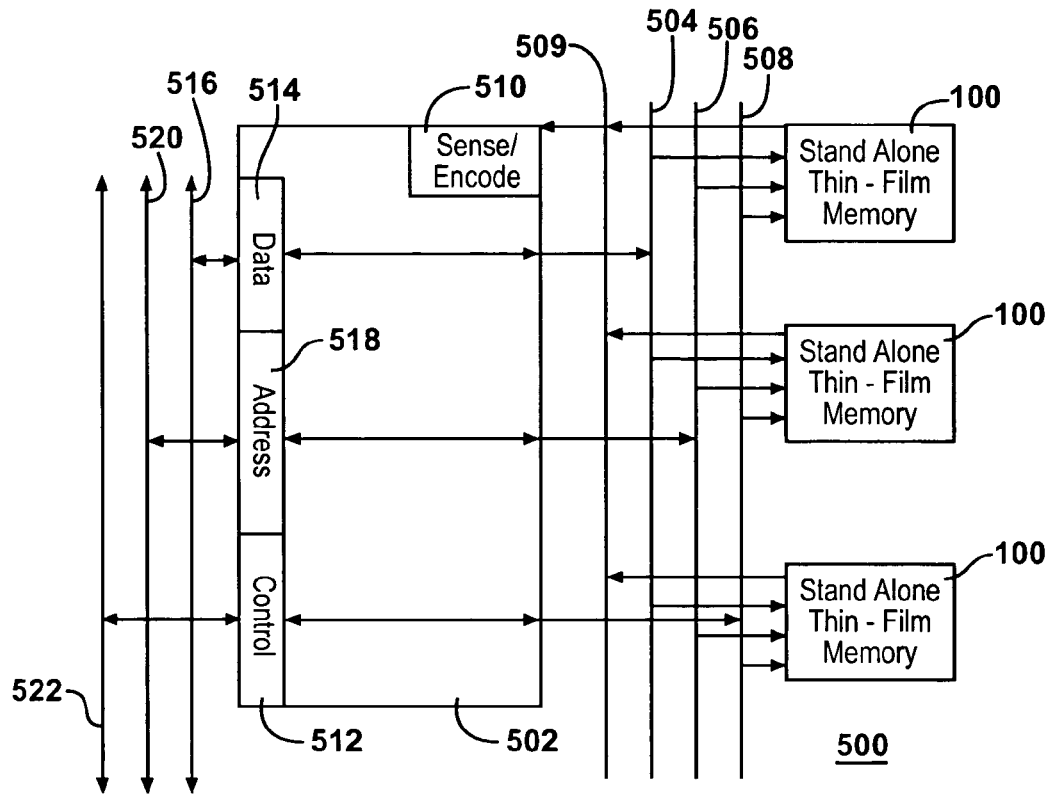
FIG. 5 is a conceptual block diagram of a memory controller configured for operation with a plurality of standalone thin film memories in accordance with the principles of the present invention.

The conceptual block diagram of FIG. 5 illustrates a memory system 500 in accordance with the principles of the present invention. The memory system 500 includes at least one standalone thin film memory 100 in accordance with the principles of the present invention, such as described in greater detail in the discussion related to previous figures. A standalone thin film memory controller 502 in accordance with the principles of the present invention is connected through DATA 504, ADDRESS 506, and CONTROL 508 busses to the one or more thin film standalone memories 100.

In this illustrative embodiment the thin film standalone memory controller 502 includes at least one sense amplifier and encoder 510 configured to receive analog data from the thin film memory 100 to convert it from analog to digital form and to encode the data represented by the analog signal. The sense/encode circuit 510 assigns different binary values, that is, encodes differently, an analog signal received from the memory 100, depending upon whether the memory 100 is configured as a binary, quaternary, or other "n-ary" memory. That is, the encoding process reflects the fact that an analog voltage signal corresponding to a given resistance within a memory cell (such as a cell OUM of FIG. 2) may be assigned one digital value for a binary memory operation but a different digital value for a quaternary memory operation, for example.

In an illustrative embodiment, the memory controller 502, through its control circuit 512, coordinates access to analog data from each standalone memory 100. Each standalone thin film memory 100 may provide multiple analog outputs, one for each data line, for example, and the memory controller 502 may accommodate the multiple analog lines by employing an analog multiplexer to feed analog signals from a number of analog data lines to a lesser number of sense amplifier/encoders. Alternatively, the controller 502 may match the number of sense amplifier/encoders to the number of analog data lines from the standalone thin film memory 100, which may be equal to the number of data lines, or the controller 502 may provide more sense amplifier/encoders than the number of analog data lines in order to expedite the analog-to-digital conversion and encoding processes.

Figure 17:
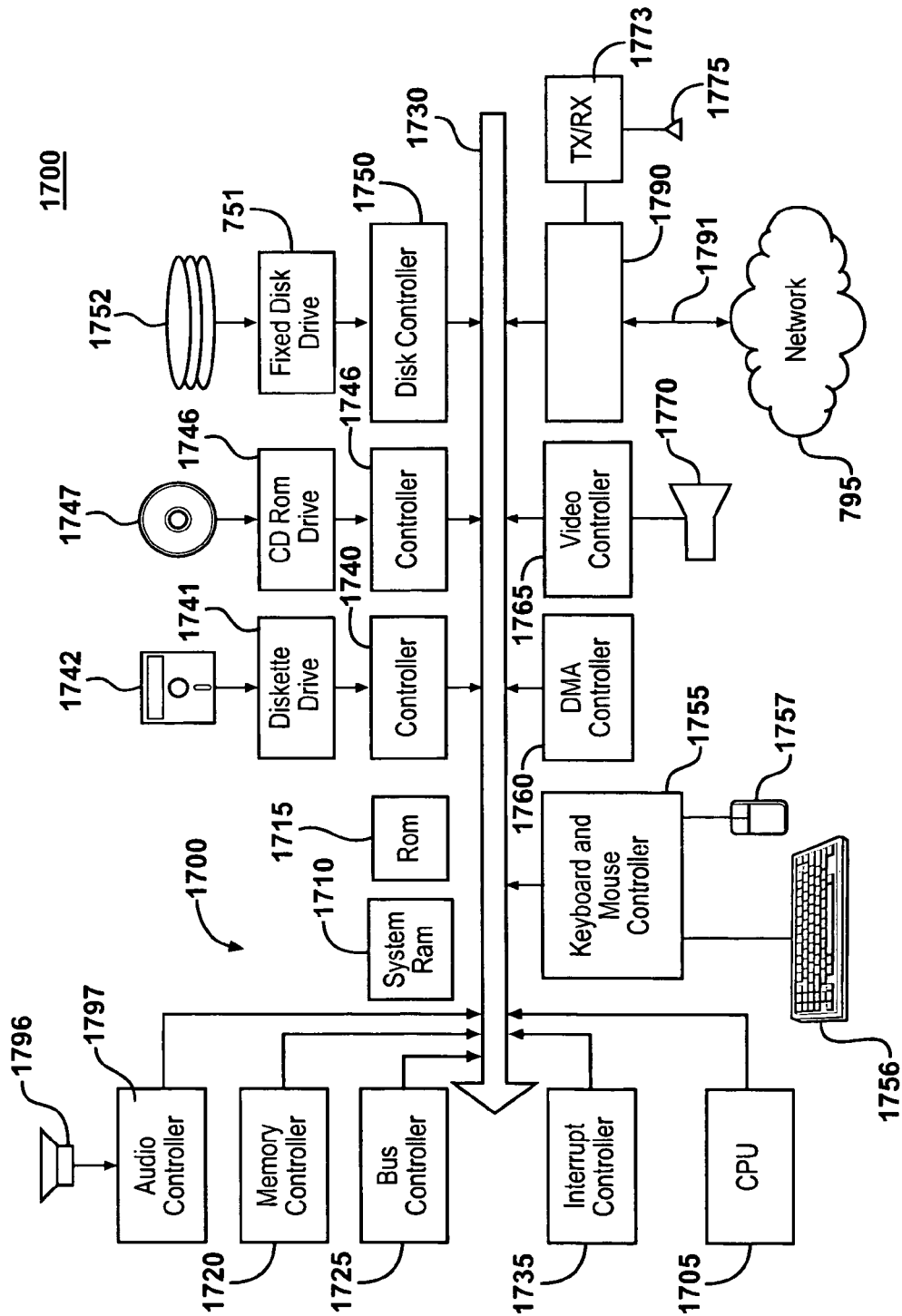
FIG. 17 is a conceptual block diagram of an electronic system such as may employ standalone thin film memories in accordance with the principles of the present invention.

Encoded digital data from the sense amplifier/encoder circuit 510 is provided to the data block 514 which provides an interface with an external data bus 516, such as data bus 1730 described in greater detail in the discussion related to FIG. 17. The data block 514 may include buffers and other associated circuitry configured to match the data rate of the one or more memories 100 to the data rate of the external data bus 516.

The control circuit 512 may include one or more output enable signals that control access to the analog bus 509 in a manner that prevents contention. In this illustrative embodiment, the output enable signal(s) are among the previously described enable signal(s) provided to a standalone memory 100. Address circuitry 518 provides an interface between an external address bus 520 and the memory address bus 506. The address circuitry 518 translates addresses presented on the external address bus 520 into addresses appropriate for each of the standalone thin-film memories 100 within the memory system 500. Control circuitry 512 provides an interface with an external control bus 522 and, in that capacity, develops control signals, including clock and enable signals for delivery to standalone thin film memories 100 through the memory control bus 509.

Functions, and associated circuits, that might otherwise be performed on each of the standalone thin film memories 100 may be concentrated on the memory controller 502, thereby reducing the cost of production for each of the memories 100, while only incrementally increasing the cost and complexity of the controller 502. The memory controller 502 may itself be an all-thin film device or it may be produced using a more conventional technology, such as complementary metal oxide semiconductor (CMOS) technology.

Figure 6:
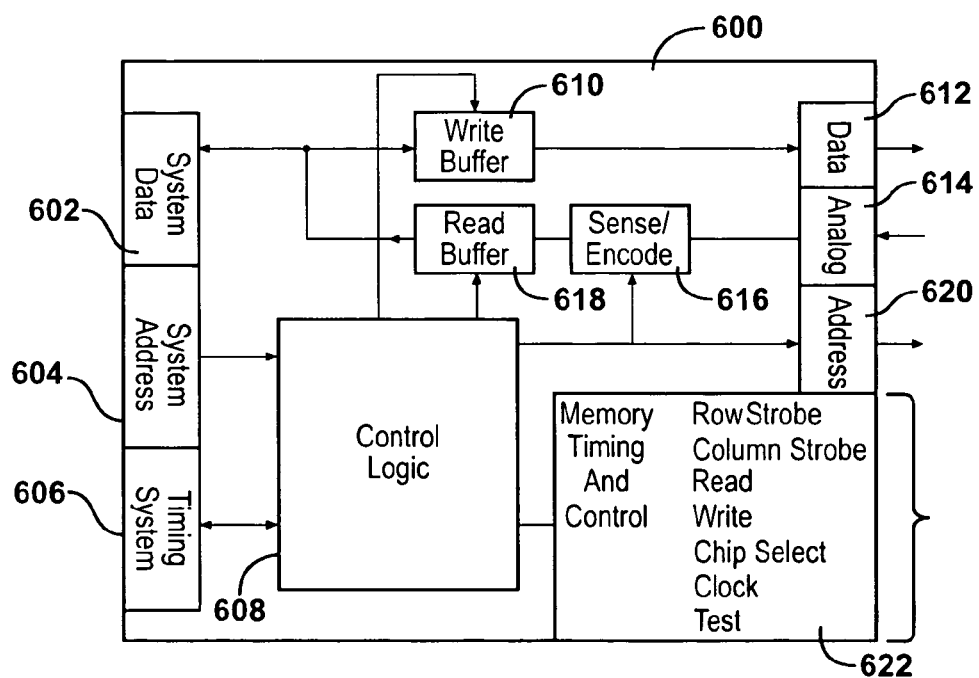
FIG. 6 is a more detailed conceptual block diagram of a standalone thin film memory controller in accordance with the principles of the present invention.

The conceptual block diagram of FIG. 6 depicts a memory controller 600 in accordance with the principles of the present invention. The memory controller 600 is adapted for operation with standalone thin film memories in accordance with the principles of the present invention and, as such, includes functional elements that allow each standalone thin film memory to offload functionality to the controller 600 and thereby reduce the complexity and cost of the standalone thin film memories serviced by the controller 600.

The controller 600 includes system data 602, system address 604, and system timing and control 606 bus interfaces. Control logic 608 directs execution of the memory controller 600. A write buffer 610 operates as temporary storage for data that is to be written to memory (such as one or more standalone thin film memories 100) through a data interface 612. An analog interface 614 accepts analog input from one or more standalone thin film memories. In an illustrative embodiment, each analog input value is an analog voltage that is representative of the resistance of a selected memory device, such as one of the memory devices labeled OUM in FIG. 2. The analog interface 614 may include signal conditioning or buffering circuitry, for example. Analog signals received at the analog interface 614 are sensed and encoded by sense/encoding circuitry 616. As previously noted the encoding circuitry may assign different digital values to a given analog signal, depending upon whether the memory from which the signal is obtained is a binary or "other-ary" memory.

In an illustrative embodiment, encoded digital information from the sensing/encoding circuit 616 is transferred to a read buffer 618 which provides temporary storage for data read from a memory. The control logic 608 operates the read 618 and write 610 buffers to execute transfers of data between the system and memory sides of the controller 600. Such transfers may include direct memory access or double data rate transfers, for example. Control logic 608 exercises control over address 620 and timing and control circuitry 622 to implement such data transfers.

In an illustrative embodiment the memory address interface 620 operates by providing addresses to standalone thin film memories in accordance with the principles of the present invention by multiplexing addresses (that is, by sequentially presenting "row" and "column" addresses). Such address multiplexing is known in the art and permits a reduction in the number of physical connections, referred to as "pinout," required for the address interface 620.

The memory timing and control circuit 622 produces signals, Row Address Strobe (RAS) and Column Address Strobe (CAS), that operate to latch the row and column components of addresses into memories being accessed. Additionally, the memory timing and control circuit 622 provides READ and WRITE signals to the memories being controlled by the memory controller 600, which the memories employ, as previously described, to develop the appropriate signal (READ, WRITE1, or WRITE0 current pulse, for example) for a memory cell being accessed. In an illustrative embodiment, the memory timing and control circuit 622 generates one or more chip select signals, CHIP SELECT, which may be employed by the controller 600 in the addressing/memory-mapping scheme.

One or more clock signals, CLOCK, may be distributed to the standalone thin film memories under control of the controller 600. Such clock signals may be used by the standalone thin film memories to develop multiphase clocks for the execution of internal logic or may be used to synchronize the memories with a system clock in order to permit rapid transfers of data between the system and memory, for example.

Test signals, labeled TEST, generated by the memory timing and control circuit 622 are employed by standalone thin film memories to perform self tests. As described in the discussion related to FIG. 14 each standalone thin film memory may include self-test circuitry. In an illustrative embodiment, a memory controller in accordance with the principles of the present invention 600 may provide support for such self tests through use of the TEST signal(s). The memory timing and control circuit 622 may include circuits for memory sequencing, sensing circuits, I/O signal amplification, redundancy control circuits, delay elements, test mode control circuits, reliability stress algorithms, address transition detection circuits (from the system address bus), user selectable operating mode detection circuits (from the system), voltage and/or current reference generators, or voltage generator modules. The memory timing and control circuit 622 may also include circuitry configured to operate with control logic 608 and the system bus interface (602, 604, 606) to provide a high speed data interface, for example.

In an illustrative embodiment, the memory controller 600 may be configured to provide refresh control for standalone thin-film programmable resistance memories in accordance with the principles of the present invention. That is, a standalone thin-film memory in accordance with the principles of the present invention may exhibit a wide range of data retention characteristics, varying from microseconds to decades and for those memories that exhibit relatively short retention periods, a memory controller in accordance with the principles of the present invention includes refresh circuitry that ensures that the memory retains data for a period of time appropriate to a given application. For example, the memory timing and control circuit 622 may operate the various memory interfaces (including the memory, data, and analog interfaces, for example) to perform a periodic read/rewrite cycle on each memory location in the bank of standalone thin film memories under control of the memory controller 600.

The memory controller 600 may also include circuitry configured for identifying and correcting "weak bits" within a standalone memory array in accordance with the principles of the present invention. The term "weak bits" refers to memory cells or elements that, although they have not failed, hold values that fall outside a preferred range of values and provide less than a desirable margin for read. To that end, in an illustrative embodiment the controller 600 may include circuitry configured to sense the value of a memory cell (which value may take the form of a resistance value) and compare that value to a preferred range of values. If the value stored within a memory falls outside the preferred range, but is, nevertheless determined to be valid (indicating that the cell has not failed), the controller rewrites the cell to a value within the preferred range.

As previously described, a 3T OTS may be employed as an access device within a thin film memory array (e.g. 3T COL, 3T CELL of FIG. 2) or as a component in a logic device, such as the decoder 300 of FIG. 3. Three terminal ovonic threshold switches are known in the art. Early work in chalcogenide devices demonstrated electrical switching behavior in which two terminal (2T) OTS switching from an "off" resistive state to an "on" conductive state was induced upon application of a voltage at or above the threshold voltage of the active chalcogenide material. This effect is the basis of the Ovonic Threshold Switch (OTS) and remains an important practical feature of chalcogenide materials. The OTS provides highly reproducible switching at ultrafast switching speeds. Basic principles and operational features of the OTS are presented, for example, in U.S. Pat. Nos. 3,271,591; 5,543,737; 5,694,146; and 5,757,446; the disclosures of which are hereby incorporated by reference, as well as in several journal articles including "Reversible Electrical Switching Phenomena in Disordered Structures," Physical Review Letters, vol. 21, p. 1450-1453 (1969) by S. R. Ovshinsky; "Amorphous Semiconductors for Switching, Memory, and Imaging Applications," IEEE Transactions on Electron Devices, vol. ED-20, p. 91-105 (1973) by S. R. Ovshinsky and H. Fritzsche; the disclosures of which are hereby incorporated by reference. Three-terminal OTS devices are disclosed, for example, in U.S. Pat. Nos. 6,969,867 and 6,967,344; the disclosures of which are hereby incorporated by reference. A logic system employing three terminal OTS devices is disclosed in a patent application filed Mar. 15, 2007, entitled, "Multi-terminal Chalcogenide Logic Circuits," and having Ser. No. 11/724,485 which is hereby incorporated by reference.

Figure 7:
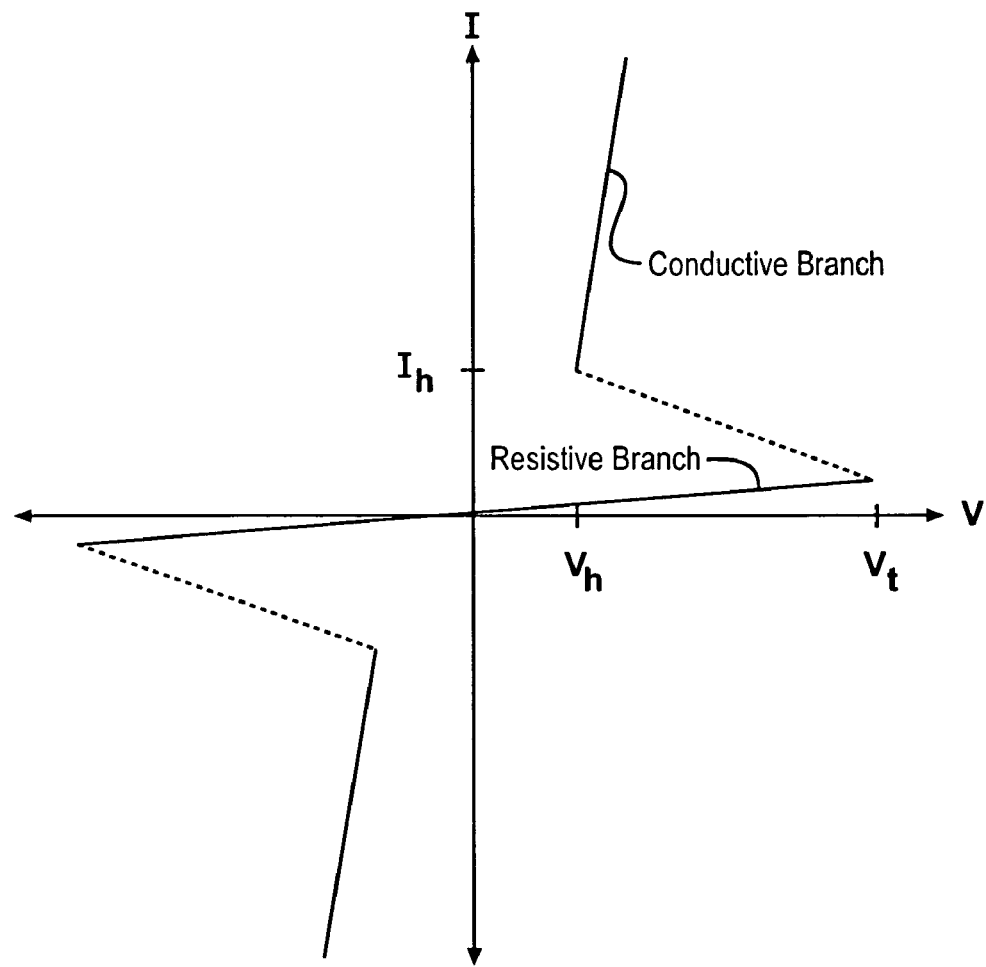
FIG. 7 is a current versus voltage plot for a conventional OTS device.

The switching properties of a 3T OTS are depicted in the current vs. voltage plot of FIG. 7. The illustration of FIG. 7 corresponds to a two-terminal device configuration in which two spacedly disposed electrodes are in contact with a chalcogenide material and the current I corresponds to the current passing between the two electrodes. The I-V curve of FIG. 7 shows the current passing through the chalcogenide material as a function of the voltage applied across the material by the electrodes. The I-V characteristics of the material are symmetric with respect to the polarity of the applied voltage. For convenience, we consider the first quadrant of the I-V plot of FIG. 7 (the portion in which current and voltage are both positive) in the brief discussion of chalcogenide switching behavior that immediately follows. An analogous description that accounts for polarity applies to the third quadrant of the I-V plot, for a symmetrical device.

The I-V curve includes a resistive branch and a conductive branch, as indicated in FIG. 7. The resistive branch corresponds to the branch in which the current passing through the material increases only slightly upon increasing the voltage applied across the chalcogenide material. This branch exhibits a small slope; it appears as a nearly horizontal line. The conductive branch corresponds to the branch in which the current passing through the material increases significantly upon increasing the voltage applied across the chalcogenide material. This branch exhibits a large slope; it appears as a nearly vertical line. The slopes of the resistive and conductive branches shown in FIG. 7 are illustrative and not intended to be limiting, the actual slopes will depend on the detailed characteristics of an actual device, including the resistance of contacts and the chemical composition of the chalcogenide material.

When no voltage is applied across the chalcogenide material, the material is in a resistive state and no current flows. This condition corresponds to the origin of the I-V plot shown in FIG. 7. The chalcogenide remains in a resistive state as the applied voltage is increased, up to a threshold voltage $V_t$. The slope of the I-V curve for applied voltages between 0 and $V_t$ is small, reflecting the high resistance of the chalcogenide material. This high resistance state may be referred to, particularly in digital applications, as the OFF state of a chalcogenide device. When the applied voltage equals or exceeds $V_t$, the chalcogenide material quickly switches from a highly resistive state to a highly conductive state, as indicated by the dashed line in FIG. 7. The chalcogenide material remains in the conductive branch as long as a minimum current $I_h$, referred to as the device's holding current, is maintained.

By adding one or more terminals to a chalcogenide switching device having the I-V characteristics displayed in FIG. 7, the threshold level of such a device may be manipulated. Multi-terminal chalcogenide switching devices are known and described, for example, in U.S. Pat. Nos. 6,967,344 and 6,969,867 and an application having publication number 2004/0178401, which are hereby incorporated by reference. In the schematic diagram of FIG. 8 a 3T OTS 800 device includes threshold switching material 802, such as chalcogenide material, a load terminal 804, a control terminal 806, and a reference terminal 808. By adding a control terminal 806 (and associated structure) to an OTS, a 3T OTS allows for the modulation of an OTS device's threshold voltage, thereby enabling controlled switching of the device 800.

In the absence of a control signal, the chalcogenide material switches from a resistive state to a conductive state upon application of a threshold voltage, where the magnitude of the threshold voltage corresponds to the threshold voltage between load 804 and reference 808 terminals. A suitable control signal at the control terminal 806 influences the threshold switching voltage of the chalcogenide material 802 between the load 804 and reference 808 terminals. With no voltage between the control 806 and reference terminals, and a voltage applied across the load 804 and reference 808 terminals that is less than the threshold voltage of the device 800, the device 800 will remain in a high resistance, non-conducting, "OFF" state. By applying a voltage or current to the control terminal 806 (that is, a voltage measured between the control 806 and reference 808 terminals), the threshold voltage across the load 804 and reference 808 terminals will be reduced. With proper biasing (e.g., with sufficient voltages or currents applied to the control and load terminals), the device 800 will switch to a highly conductive "ON" state.

Figure 9:
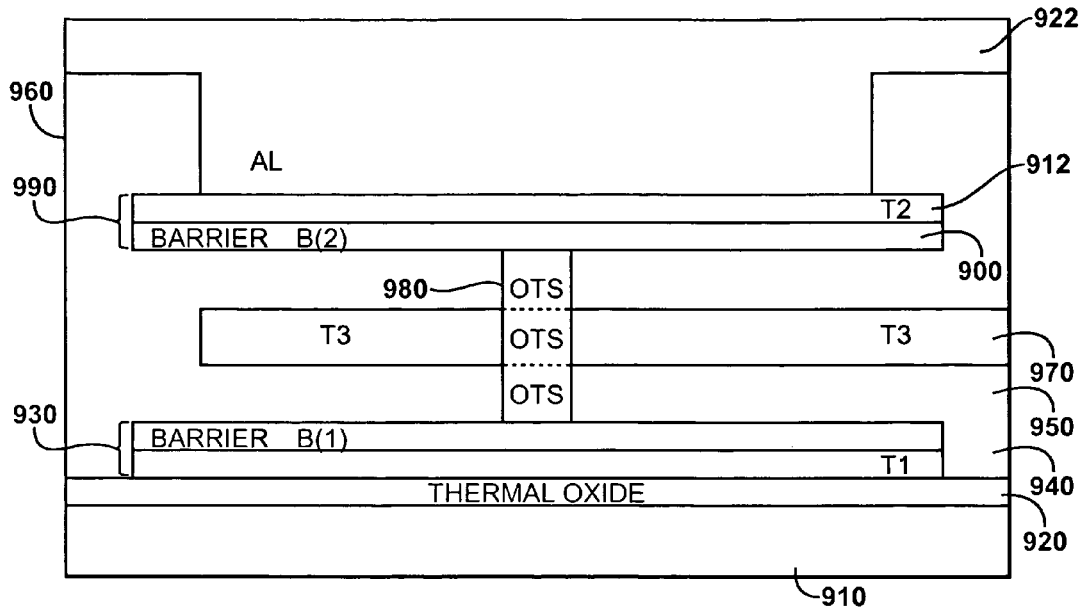
FIG. 9 is a cross sectional view of the structure of a three terminal OTS device in accordance with the principles of the present invention.

FIG. 9 is an illustrative cross section of a 3T OTS, such as may be employed in a device in accordance with the principles of the present invention. The three terminals are labeled T(1), T(2), and T(3). Such a device may be formed using conventional sputtering, chemical vapor deposition, etching, and lithography techniques. In this illustrative embodiment, the structure includes a substrate 910, a thermal oxide layer 920, a bottom electrode 930 that includes a conductive layer 940 formed from TiW or a combination of Ti and TiN and a carbon barrier layer 950, an $SiO_x$ or $SiN_x$ insulating region 960, a control electrode 970 formed from TiW, a chalcogenide material 980, a top electrode 990 that includes a carbon barrier layer 900 and a conductive layer 912 that includes Ti and TiN, and an Al layer 922.

In this example, the chalcogenide material 980 is an OTS material, as for example an alloy composed of AsGeInSiTe 35/7/0.25/18/40 and is labeled OTS in FIG. 9. The barrier layers inhibit diffusion and electromigration of material into the chalcogenide region and improve the cycle life of the device. Typical layer thicknesses are as follows: conductive layer 940 (100 nm), barrier layer 950 (30 nm), control electrode 970 (10-40 nm), barrier layer 900 (100 nm), and conductive layer 912 (100 nm). The region occupied by the chalcogenide material in the device of this example is cylindrical with a height of approximately 0.1 micron and a diameter of about 1 micron. The region occupied by the chalcogenide material in this illustrative embodiment may be referred to herein as a pore or pore region for example.

Figure 8:
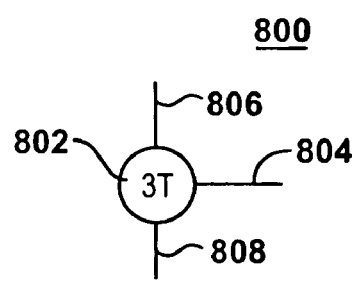
FIG. 8 is a schematic diagram of a three terminal OTS device in accordance with the principles of the present invention.

The electrodes 930, 970 and 990 are in electrical communication with the chalcogenide and correspond to terminals 808, 806, and 804, respectively, of FIG. 8. The control electrode 970 circumscribes the chalcogenide material 980. As previously noted, the top electrode 990 and bottom electrode 930 may also be referred to as the load and reference electrodes, respectively. In circuits analogous to common-emitter configurations, the reference electrode 930 may be connected in the "common" or "reference" position. The electrodes are separated by insulating material so that electrical communication between electrodes occurs through the chalcogenide material.

In an illustrative embodiment, the substrate 910 may be an amorphous material, such as glass. Such an embodiment will be described in greater detail in the discussion related to FIG. 15. The composition and/or thickness of the various layers, and, in particular, of the chalcogenide layer, may be tailored to adjust operational parameters of the device. Such tailoring may include tailoring of 3T OTS for preferential operation in the I or III quadrant of the I-V plane, for example.

Figure 10:
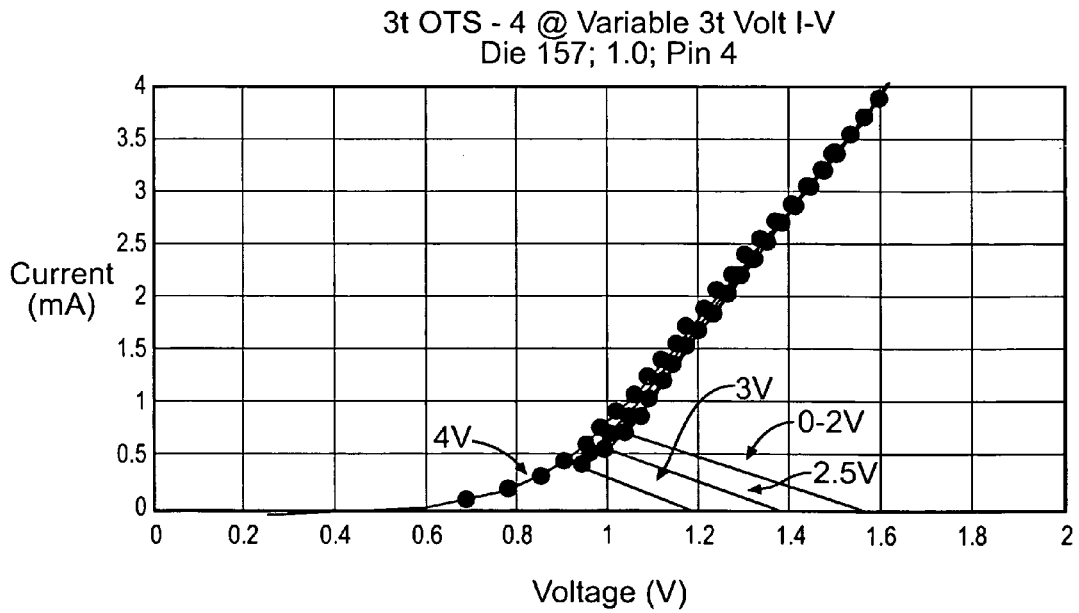
FIG. 10 is plot of current versus voltage for a three terminal OTS device in accordance with the principles of the present invention.

The graphical representation of FIG. 10 depicts the first quadrant of an I-V plot which illustrates the switching characteristics of a 3T OTS such as may be used in a device in accordance with the principles of the present invention. The current I corresponds to the current passing between the load (top) and reference (bottom) electrodes of the structure and the voltage V corresponds to the voltage applied between the load and reference electrodes. In this illustrative embodiment, the I-V relationship between the load and reference electrodes are plotted for several different control voltages applied to the control electrode. The plots represent an operation in which a control voltage of constant magnitude is applied to the control terminal and the current between the load and reference electrodes measured as a function of the voltage applied between the load and reference electrodes. In this illustrative embodiment, the control voltage may be applied in the form of a long duration voltage pulse (e.g. 3 microseconds) and the voltage between the load and reference electrodes applied in the form of a short duration pulse (e.g. 100 nanoseconds) while the control voltage was being applied. In this example, the control voltage is applied between the control electrode and reference electrode of the device.

The data in FIG. 10 indicate that application of a control voltage to the control electrode may be used to modulate the threshold voltage between the load and reference electrodes. The different I-V curves correspond to tests using different control voltages. The control voltage associated with each I-V curve is indicated with a label in FIG. 10. The I-V curve labeled "0-2V" shows the behavior of the device for control voltages between 0 V and 2 V, inclusive. Since the I-V characteristics of the device are substantially identical for control voltages in this range, a single curve is presented for applied voltages in this range. The "0-2V" data indicate that the resistive branch of the I-V curve extends from an applied voltage of 0 V up to a voltage threshold voltage of about 1.56 V. Once the threshold voltage is reached, the device switches to the conductive branch. The switching transformation is indicated by the negative sloped line segments in the I-V curve.

In this illustrative embodiment, increasing the control voltage above 2 V yields a decrease in the device's threshold voltage. The I-V curve labeled "2.5V" indicates that a control voltage of 2.5 V reduces the threshold voltage by over 10% to a value slightly below 1.4 V. A further increase of the control voltage to 3 V leads to a decrease in the threshold voltage of about 25% to a value of about 1.2 V. When a control voltage of 4 V is applied, the threshold voltage is effectively eliminated and the chalcogenide material between the load and reference electrodes is in its conductive state over the full range of applied voltages (that is, voltages between the load and reference terminals).

The data presented in FIG. 10 demonstrate an ability to modulate the threshold voltage between two electrodes of a multi-terminal device by applying a control voltage to a control terminal. The modulation effect represents functionality achievable in the instant multi-terminal devices that is not available in standard two-terminal devices. While not wishing to be bound by theory, it is believed that application of a control signal of sufficient magnitude to a control terminal may facilitate formation of a conductive filament between the control terminal and another of the 3T OTS terminals, thereby producing the observed reduction in threshold voltage between load and reference terminals.

The minimum control signal required to facilitate filament formation may be referred to as a critical control signal (between 2.0V and 2.5V for the example discussed in relation to FIG. 10). It is believed that the critical control signal is the minimum signal required to form a filament within the chalcogenide material between the control terminal and another of the terminals (that is, reference or load terminal). The presence of this filament is believed to alter the chalcogenide material in such a way that the threshold voltage required to form a filament between the load and reference electrodes is reduced. The presence of a conductive filament between the control and another of the terminals may produce electric fields or potentials within the chalcogenide material that lower the voltage required to form filaments in other portions of the chalcogenide material.

As the control signal is raised above the critical value, the cross-section of the filament between the control electrode and another of the terminals is believed to increase and a greater volume of the chalcogenide material is believed to be influenced by the control signal. The decrease in the threshold voltage between the load and reference electrodes with increasing control voltage may be due to an enlargement of a filament between the control and load or reference terminal, with the resulting filament boundary approaching the other terminal (reference or load terminal, respectively. The closer proximity suggests that a smaller electric field, and hence a smaller threshold voltage, is required to establish a filament between the load and reference electrodes.

A filament may form, for example, between the load and reference electrodes through a branching of the filament present between the control and reference electrodes. In such a branching process, a portion of a filament between the load and reference electrodes exists within the filament present between the control and reference electrodes and the voltage required to complete the filament may be that required to form a filament between the load electrode and some point, a branching point, along the existing filament. Since the distance between the load electrode and a branching point of an existing filament is likely to be smaller than the distance between the load and reference electrodes, the magnitude of the electric field or voltage required to complete a filament to the load electrode is reduced.

In the above example, at some control signal sufficiently above the critical control signal, it may be expected that the filament formed between the control electrode and the reference electrode is sufficiently enlarged that the boundary of the filament overlaps or makes contact with the load electrode. When this occurs, it is believed that the threshold voltage between the load and reference electrodes decreases to zero.

In addition to modulating the threshold voltage between two terminals, the instant multi-terminal devices may be used to modulate the conductivity of the chalcogenide material between two terminals. This capability can be demonstrated using the representative device structure illustrated in FIG. 9 and the data plotted in FIG. 10. As an example, consider the application of a voltage of 1.5 V between the load and reference electrodes in the absence of a control voltage. As shown in FIG. 10, application of a voltage of 1.5 V between the load and reference electrodes is unable to switch the device because 1.5 V is a sub-threshold voltage. The chalcogenide material between the load and reference electrodes therefore remains in a resistive state and the conductivity between the load and reference electrodes is low. By applying a control voltage of sufficient magnitude while maintaining the same voltage between the load and reference electrodes, it becomes possible to effect a switching event between the load and reference electrodes and thereby to induce a pronounced increase in the conductivity of the chalcogenide material between the load and reference electrodes.

In the case in which a voltage of 1.5 V is applied between the load and reference electrodes, control voltages between 0 V and 2 V do not decrease the threshold voltage or influence the conductivity of the chalcogenide material between the load and reference electrodes. A control voltage of 2.5 V, however, decreases the threshold voltage to below 1.5 V thereby inducing a transformation of the chalcogenide material between the load and reference electrodes from a resistive state to a conductive state. The transformation is accompanied by a decrease in the voltage between the load and reference electrodes along with an increase in current. The voltage between the load and reference electrodes decreases to a voltage at or above the holding voltage.

Although the device is resistive and inhibits signal transmission between the load and reference electrodes in the absence of a control signal, the device becomes conductive and more readily transmits signals when a control voltage of sufficient magnitude is provided. An appropriate control signal may therefore be used to increase the conductivity of the chalcogenide material between two non-control electrodes when a suitable voltage is present therebetween. The suitable voltage must be less than the threshold voltage with no voltage applied to the control terminal, but greater than the threshold voltage when the appropriate control signal is applied to the control terminal. The conductivity of the chalcogenide material between two non-control electrodes may analogously be increased by removing or decreasing the magnitude of the control signal applied to the control terminal. Judicious control of the timing, duration and/or magnitude of a control signal may thus be used to modulate the conductivity of the chalcogenide material between two non-control terminals.

3T OTS devices in accordance with the principles of the present invention may exhibit advantageous threshold-voltage modulation characteristics. In particular, a 3T OTS device in accordance with the principles of the present invention may exhibit different responses to modulation voltages applied across different terminals. In an illustrative embodiment, for a given voltage applied across a 3T OTS' control and reference terminals, the device's threshold voltage is reduced to a given voltage, or to 0V; but the same voltage applied across the device's control and load terminals does not reduce the device's threshold voltage. Rather, a larger voltage must be applied across the control and load terminals in order to reduce the device's threshold voltage.

Similarly, a 3T OTS device may be configured to require a greater modulation voltage across its control and reference terminals to achieve the same threshold voltage reduction as a smaller modulation voltage applied across its control and load terminals. As described in greater detail in the discussion related to the logic devices of FIGS. 12 through 14, such asymmetry (that is, the requirement of a greater control to load terminal (control to reference) voltage than control to reference terminal (control to load) voltage in order to achieve the same reduction in device threshold voltage is particularly advantageous in logic circuits that employ 3T OTS devices. Typically, in such logic circuit embodiments, the un-modulated threshold voltage of the 3T OTS device is greater than the maximum signal voltage of such a circuit.

Figure 11:
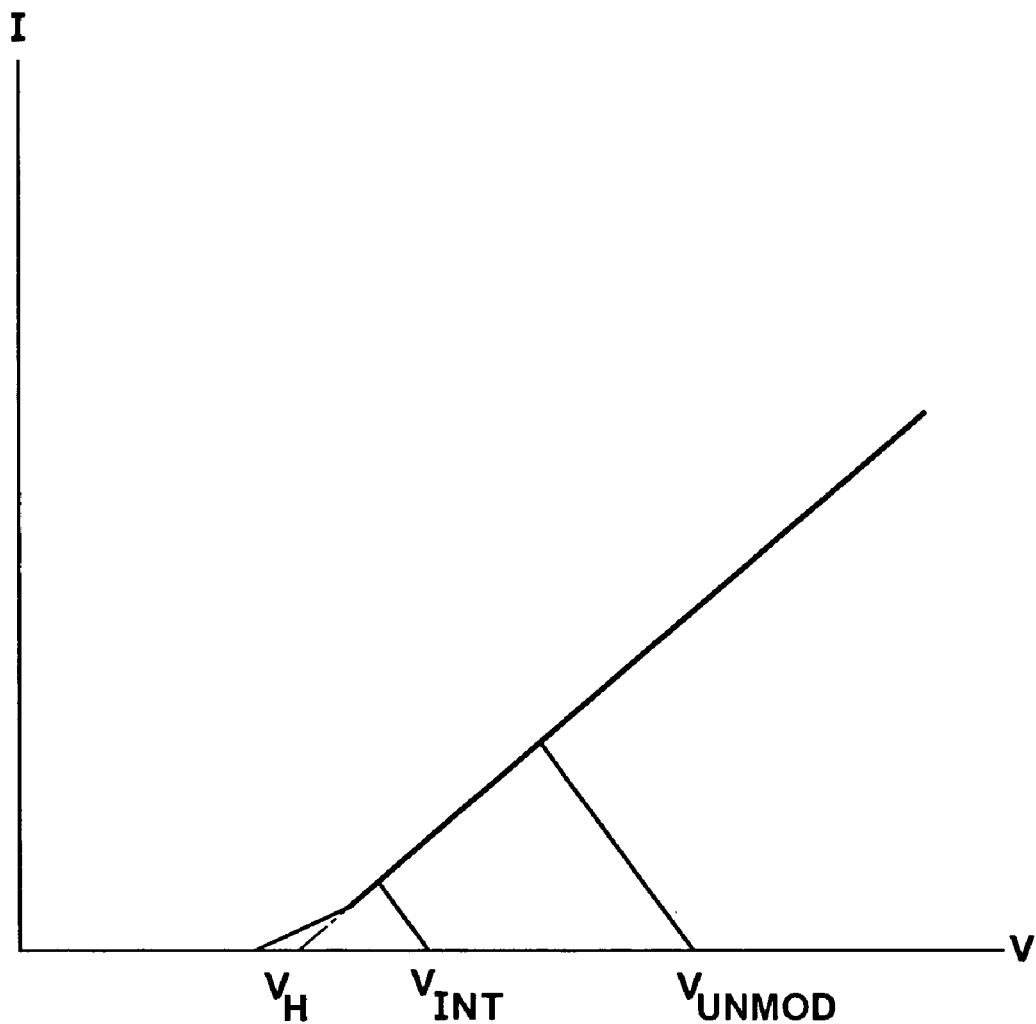
FIG. 11 is a plot of current versus voltage for asymmetrical 3T OTS devices in accordance with the principles of the present invention.

The current vs. voltage plot of FIG. 11 depicts the characteristics of a 3T OTS device in accordance with the principles of the invention for which a modulating voltage is impressed across the control/reference terminals. In this illustrative embodiment, the device's un-modulated threshold voltage is labeled $V_{UNMOD}$. Application of an intermediate modulation voltage across the control/reference terminals reduces the threshold voltage to a value $V_{INT}$. Application of a greater modulation voltage reduces the device's threshold voltage to below the device's holding voltage, $V_H$. In an illustrative embodiment, the un-modulated threshold voltage $V_{UNMOD}$ is 4.0V, the holding voltage is 0.5V, and the control/reference voltage required to reduce the device's threshold voltage to below the holding voltage VH is 1.0V. Additionally, in this illustrative embodiment, the modulation voltage across the control/load terminals required to reduce the device's threshold voltage to below $V_H$ is 3.0V. Such modulation-voltage asymmetry may be achieved, for example, in the structure of FIG. 9 by locating the control terminal T3 closer to either the reference terminal (to reduce the required control/reference modulation voltage) or to the load terminal (to reduce the required control/load modulation voltage). Other means may be employed to achieve such modulation voltage asymmetry. For example, different types of OTS material may be located between the control and reference terminals than located between the control and load terminals. OTS materials between the different terminals may be differentially modified by implant, reactive processing, or other technique, for example, to achieve the desired threshold-modulating asymmetry.

The schematic diagrams of FIGS. 12A, 12B, 12C, 12D, and 12E illustrate symbols and associated operating biasing of asymmetrical 3T OTS devices, such as those described in the discussion related to FIG. 11. The symbol 3TP of FIG. 12A indicates that the 3T OTS is configured to preferentially operate in a manner analogous to a p-channel field effect transistor (p-FET), as indicated by the negative signs in front of the control −C and load −L terminals. For this bias configuration, the voltages associated with the device's terminals, control C, load L and reference R, are measured with respect to the reference terminal R, reference terminal R is assigned a voltage of 0V. In this illustrative embodiment, the modulating voltage required to reduce the device's threshold voltage to a desired value is labeled between the respective terminal pairs, with a 1.0 V modulating voltage required between the control and reference terminals and a 3.0V modulating voltage required between the control and load terminals. As previously noted, the desired value to which the threshold is reduced may be below the device's holding voltage VH, for example.

FIG. 12B illustrates an equivalent configuration in which the reference terminal R is at a positive voltage and the load L and control C terminals may take on values of 0V and above. Such a configuration is the most commonly encountered circuit configuration.

The "P" in the "3TP" symbol is meant as a short-hand reference to the operation of an enhancement mode p-channel MOSFET, which the 3TP device, because it is configured to preferentially operate as biased in FIG. 12A, to some extent, emulates. The symbol 3TN of FIG. 12C indicates that the 3T OTS is configured to preferentially operate, as indicated by the positive signs in front of the control +C and load +L terminals. Because the voltages associated with the device's terminals, control C, load L and reference R, are measured with respect to the reference terminal R, reference terminal R is assigned a voltage of 0V. The "N" in the "3TN" symbol is meant as a short-hand reference to the operation of an enhancement mode n-channel MOSFET, which the 3TN device, because it is configured to preferentially operate within a logic circuit in a manner that, to some extent, emulates the operation of an N-FET. FIGS. 12D and 12E present equivalent symbols for 3TP and 3TN OTS devices, respectively. As may be apparent from the Figures and prior discussion, a single device may be operated as either a 3TN or 3TP device, depending upon its configuration within a circuit. That is, by reversing the load and reference connections to an external circuit, the respective modulating voltages (R to C and C to L) are reversed, and the device operates accordingly.

Employing the partial-filament model described in the discussion related to FIG. 10, it is believed that asymmetric 3T OTS devices in accordance with the principles of the present invention employ a control voltage to form a filament between the control terminal and either the reference terminal or load terminal to thereby reduce the overall threshold of the device. Depending upon device configuration (e.g., relative spacing between control, reference, and load terminals), filament formation between one set of terminals requires the application of a greater voltage than required for the other set of terminals.

Thin film devices, such as 3T OTS devices, may be employed in thin film logic circuits in accordance with the principles of the present invention to produce standalone thin film memory circuits such as the decoder described in greater detail in the discussion related to FIG. 3A. In an illustrative embodiment, 3T OTS devices are arranged as a multi-phase clock logic circuit to yield thin film decoders, latches, and other circuits that may be employed by a standalone thin film memory in accordance with the principles of the present invention. Multi-phase clock logic systems are known and disclosed, for example U.S. Pat. Nos. 3,590,273 and 3,935,474, which are hereby incorporated by reference. A multi-phase logic circuit that employ 3T OTS devices is disclosed in a patent application having publication No. 11/724,485, filed Mar. 15, 2007 entitled, "MULTI-TERMINAL CHALCOGENIDE LOGIC CIRCUITS," which is hereby incorporated by reference.

Thin film logic circuits in accordance with the principles of the present invention employ thin-film switching devices to execute complementary logic functions; there is no direct conduction path between a system supply and a system return. In such a system, power is only dissipated when driving the capacitance associated with terminals and interconnect to different voltage levels. To a first approximation there is no static power dissipation. In an illustrative embodiment, complementary logic circuits in accordance with the principles of the present invention employ three-terminal threshold switches as switching elements. More particularly, asymmetric threshold three-terminal ovonic threshold switches may be combined in accordance with the principles of the present invention to produce complementary logic families.

Logic circuits in accordance with the principles of the present invention include inverters (NOT), AND, OR, NAND, NOR, XOR, and XNOR gates. Any logic function may be built using a subset of these basic gates (a complete set of logic functions may be produced, for example, using only NAND and NOT gates). Such gates may be combined to form a flip-flop, a latch, or a memory decoder, for example. By combining sequential and combinatorial complementary thin film logic devices in accordance with the principles of the present invention any digital logic device, including, for example, shift register, memory controller, arithmetic logic unit, sequencer, microprocessor, or microcontroller may be implemented. Logic gates in accordance with the principles of the present invention may also be employed in embedded devices, such as devices that include both thin-film memory and thin film logic in a single standalone circuit.

The 3T OTS logic family disclosed in the '485 application employs a multi-phase clocking system which is described in detail therein. FIG. 13 is a schematic diagram of a 3T OTS inverter 1300 in accordance with the principles of the present invention. Biasing circuitry, clock circuitry and timing diagrams, discussed in detail in the '485 application, will not be described herein. In the schematic diagram of FIG. 13, the inverter 1300 includes 3TP 1302 and 3TN 1304, with their control terminals connected together to form an input IN to the inverter 1300, their load terminals connected together to form an output OUT from the inverter 1300 and their respective reference terminals connected to CLOCK and GROUND.

In operation, when the clock input is "high" and a "high" input voltage is applied to the input IN, the positive control-to-reference voltage on the 3TN device 1304 lowers the threshold voltage of the device 1304 and the 3TN device, with proper biasing from the next logic stage, "thresholds" (that is, becomes highly conductive). The highly conductive path through the 3TN device 1304 ensures that the output terminal OUT remains at approximately a holding voltage drop above ground. That is, the 3TN device 1304 drains charge from the output terminal OUT so long as enough current is supplied from the subsequent logic stage back through the device 1304, to sustain a holding current. This results in the OUT voltage dropping to a holding voltage Vh. Any leakage current that might otherwise charge the output terminal OUT will be drained by the 3TN device 1304 to maintain an OUT voltage of Vh.

In an illustrative embodiment a 2.5V signal represents a "HIGH" logic value, 0.5V is the holding voltage of the 3T OTS devices, a 0.5V signal represents a "LOW" logic value, and the clock value is 3.0V. The respective threshold-modulation values of the devices are 1.0V and 3.0V for the control-reference and control-load terminals. In this illustrative embodiment, the un-modulated threshold value of the devices is 4.0V. With an input of 2.5V the 3TN device 1304 thresholds and the output voltage is 0.5V. The voltage across the device 1302 is, therefore, 2.5V, but the native threshold voltage of the device is 4.0V and, consequently, the device 1302 will not threshold. Additionally, the control-to-load and control-to-reference voltages for the device 1302 are, respectively, 2.0V and 0.5V, neither of which is sufficient to threshold the device 1302. Analogous observations may be made with respect to a logic low input of 0.5V.

The schematic diagram of FIG. 14 illustrates a NAND gate 1400 in accordance with the principles of the present invention. In this illustrative embodiment 3TP devices 1402 and 1404 have their reference terminals connected to the clock signal CLK and their load terminals connected to the output OUT. 3TP device 1402 has its control input connected to a first NAND input INA and 3TP device 1404 has its control terminal connected to a second NAND input INB. 3TN device 1406 has its load terminal connected to the output terminal OUT, its control terminal connected to input INA and its reference terminal connected to the load terminal of 3TN device 1408. 3TN device 1408 has its control terminal connected to input INB and its reference terminal connected to ground.

With 3TP (1402 and 1404) and 3TN (1406 and 1408) devices respectively arranged in parallel and series, whenever one or both inputs INA or INB is "LOW," one of the 3TP devices will threshold and pull the output OUT "HIGH." Because at least one of the series-connected 3TN devices will be "OFF" (that is, non-thresholding), there will be no contention from a 3TN device that might otherwise threshold. Only when both inputs INA and INB are "HIGH" will both 3TN devices threshold and neither 3TP device threshold. In that case, the output OUT will be pulled low by the 3TN devices 1406 and 1408. This describes the operation of a NAND gate.

Using the INVERTER of FIG. 13 and NAND gate of FIG. 14, any logic function may be implemented, including, for example, the decoder described in the discussion related to FIG. 3A and latch described in the discussion related to FIG. 3B. Thin film latches in accordance with the principles of the present invention may be employed to latch row and column addresses such as may be employed by row and column decoders such as thin film decoders in accordance with the principles of the present invention.

A standalone thin film memory in accordance with the principles of the present invention may include built in self test (BIST) circuitry that is implemented in thin film technology, such as the 3T OTS logic described herein. The BIST circuitry may include microcode storage and a micro-sequencer configured to perform device self tests. More elaborate thin-film logic circuits, such as microprocessors and microcontrollers are within the scope of the invention.

FIGS. 15A through 15K will be used to describe illustrative processes for forming a thin film memory/thin film logic combination in accordance with the principles of the present invention. FIG. 15L illustrates a stack of memory layers that may be formed on top of the layers described in the discussion related to FIGS. 15A through 15K. For convenience of illustration and clarity of explanation, process steps and optional structures, such as barrier layers or contact layers, for example, may not be included in this description. Such steps and structures will be known to those skilled in the art. The term layer may be used herein to refer to a single layer of material or to a layer that includes one or more sub-layers, such as a layer of thin film logic that may include sub-layers of electrode material, dielectric, and sub-layers of threshold-switching material, for example. Deposition steps may be carried out using known thin-film deposition techniques, including but not limited to, sputtering (PVD), LPCVD, PECVD, or MOCVD, for example.

Figure 15A:
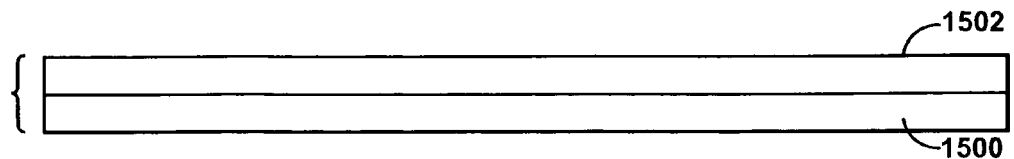
FIGS. 15A through 15L are cross-sectional views of stacked memory elements in a standalone thin film memory in accordance with the principles of the present invention and steps employed in the process of forming such a memory.

In FIG. 15A a thin film of terminal material 1502 (also referred to herein as electrode material) is deposited on a layer of substrate material 1500. The terminal material 1502 may be Ti, TiN, TiW, C, SiC, TIAIN, TiSiN, polycrystalline silicon, TaN, some combination of these, or other suitable conductors or resistive conductors, for example. In various illustrative embodiments the substrate material may be a single-crystalline material or non-single-crystalline material. In an illustrative embodiment, single-crystalline material may, for example, include conventional single-crystal logic, such as complementary metal oxides semiconductor (CMOS) logic. In non-single-crystalline substrate embodiments, the substrate may be an inexpensive material, such as glass, ceramic, or fiberglass, for example.

Figure 15B:
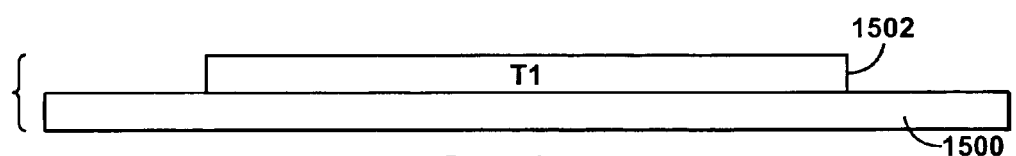
Figure 15C:
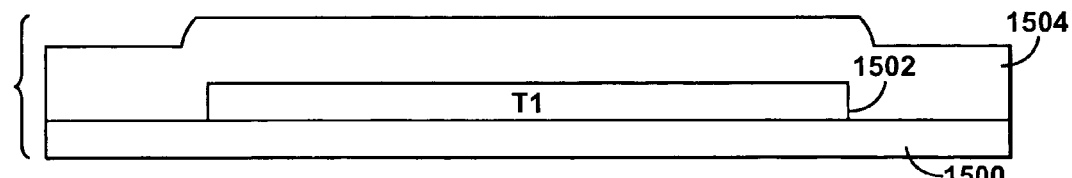

In FIG. 15B the terminal material 1502 has been patterned to form a terminal T1. The patterning process may include photo-lithographic steps, such as masking and etching for example. After the patterning of FIG. 15B a layer of dielectric material 1504 is deposited in the step depicted in FIG. 15C. The dielectric material may be silicon dioxide, for example. In the step related to FIG. 15D the dielectric material 1504 is planarized. The planarization process may employ chemical mechanical polishing (CMP) for example.

Figure 15D:
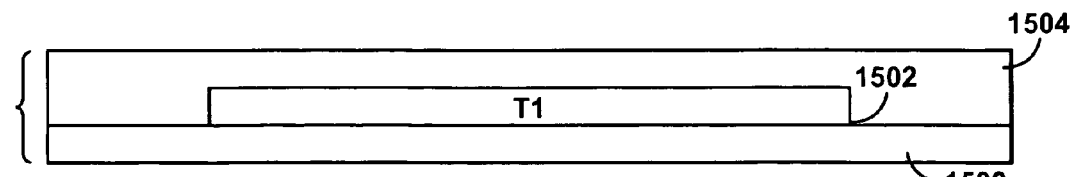
Figure 15E:
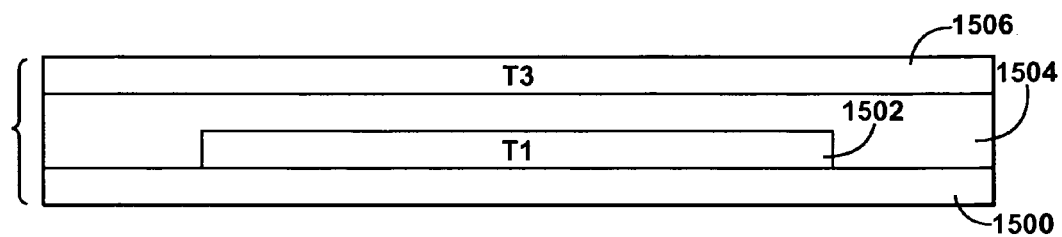
Figure 15F:
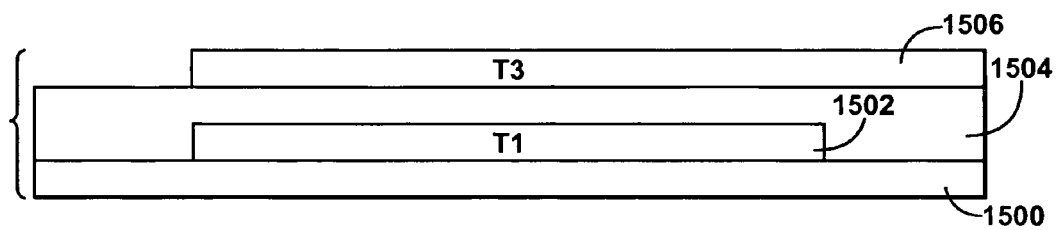
Figure 15G:
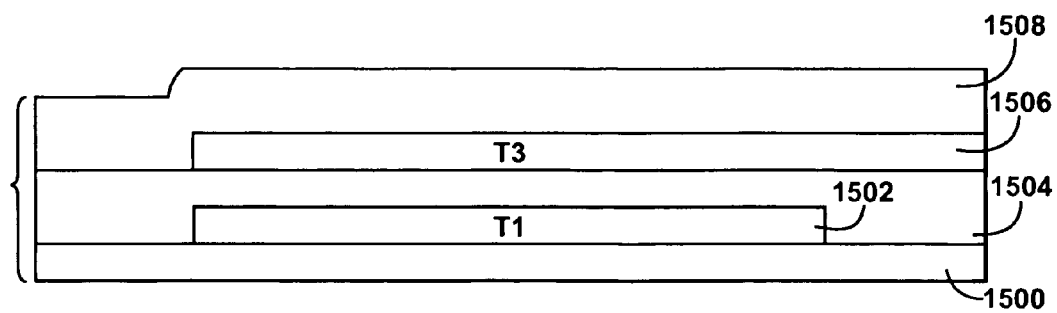
Figure 15H:
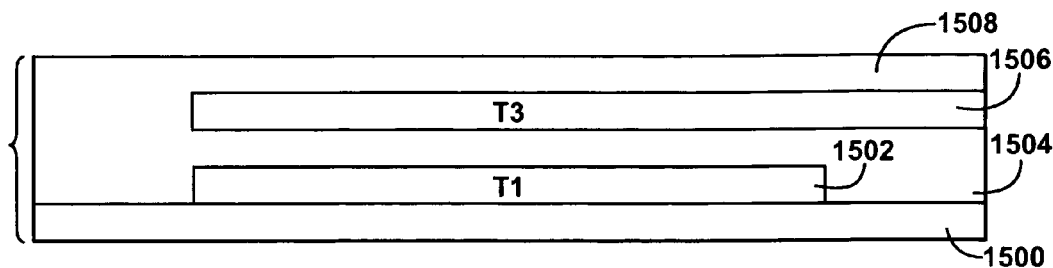

After the planarization of FIG. 15D, a layer of terminal material 1506 is deposited. This layer of terminal material will be used to form a terminal T3, which will form a control terminal in a 3T OTS device in accordance with the principles of the present invention. The control terminal T3 is patterned in the step associated with FIG. 15F and a layer of dielectric material 1508 is deposited over the entire structure in the step associated with FIG. 15G. The dielectric material 1508 is planarized in the step associated with FIG. 15H.

In the step associated with FIG. 15I, a pore 1510 is formed in the multilayer stack extending through the dielectric layer 1508, the T3 terminal layer 1506, the dielectric layer 1504, and stopping at the T1 terminal layer 1502. A layer of threshold-switching material 1512 (OTS) is deposited in the step associated with FIG. 15J. The threshold switching material 1512 fills or coats the sidewalls and bottom of the pore 1510. A layer 1514 of terminal material T2 is deposited in the step associated with FIG. 15K. This layer of terminal material may serve as either the load or reference terminal of a 3T OTS in accordance with the principles of the present invention. The terminal material 1514 may be patterned, using conventional photolithographic and etching techniques, for example, to form the desired structure shown in FIG. 15L.

As previously described, 3T OTS devices in accordance with the principles of the present invention may be formed as asymmetric-threshold devices and the threshold asymmetry of these devices may be implemented by forming the device with different thicknesses of threshold switching material between the control/reference terminal pair than between the control/load terminal pair (e.g., between the top of T1/bottom of T3 and between the bottom of T2/top of T3). Different types of OTS material may be deposited between the terminal pairs to implement such threshold asymmetry.

A layer of 3T OTS devices formed in the manner just described may be interconnected to form a layer of complementary logic. This layer of complementary logic may include logic functions such as previously-described address latches and decoders, for example. One or more layers of thin film memory, such as illustrated in FIG. 15L may be deposited on top of this layer of complementary thin film logic. Additional layers of complementary thin film logic may be interspersed within the stack of thin film memory described in greater detail in the discussion related to FIG. 15L.

Referring to FIG. 15L, a standalone all thin film memory 1500 in accordance with the principles of the present invention may include thin film memory devices and thin film access devices, such as 3T OTS devices, stacked one upon another. Because thin film materials and processes are employed, the memory 1500 may be deposited on a relatively inexpensive substrate 1502 such as glass, ceramic, or other material; a conventional single crystal silicon substrate is not needed. Thin film processing techniques also permit the stacking of such devices.

Figure 15:
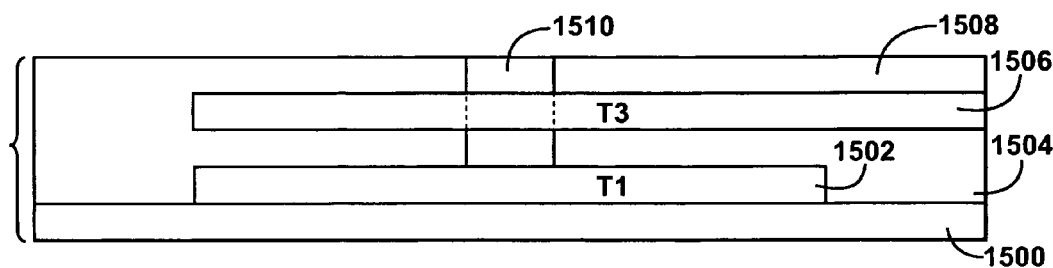
Figure 15J:
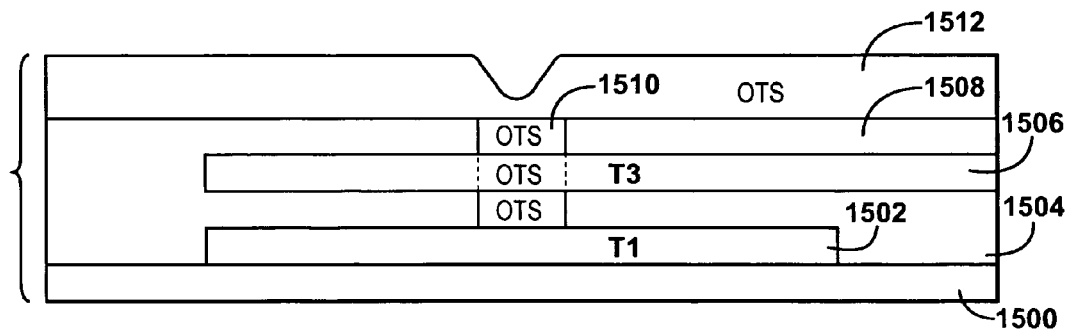
Figure 15K:
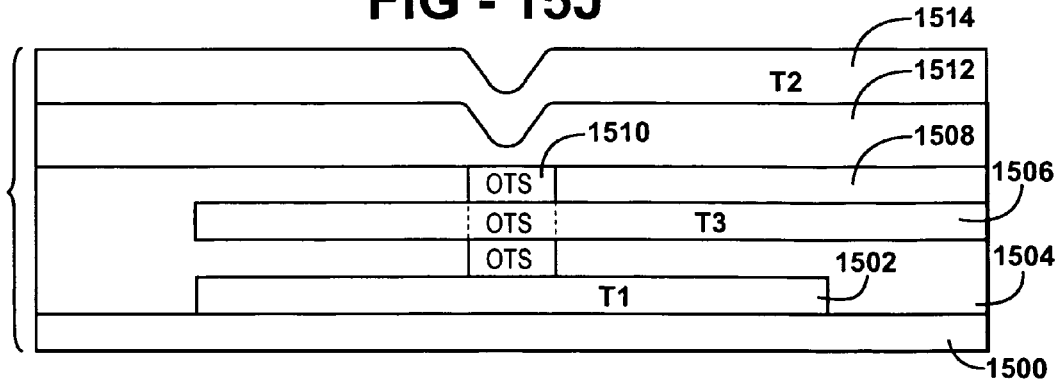

The phase change memory elements 14a-14d in FIG. 15 of this illustrative embodiment may be implemented by a series of layers provided underneath the selection devices 16a-16d. The memory elements 14a-14d and selection devices 16a-16d may be, respectively, phase change memories and 3T OTS devices as described in the discussion related to FIGS. 1 and 2. Vias 18 may be provided between adjacent levels to provide interconnection between wiring conductors on those levels.

In this illustrative stacked thin film memory, addressing lines are shared. For example, line 12d, is shared between directly overlying cells (including the element 14d and the selection device 16d), providing a rowline to those cells; and directly underlying cells (including the selection device 16c and the memory element 14c), providing a column line to those cells. Similarly, the line 12c functions for selection of the directly overlying cells (including the selection device 16c and the memory element 14c), providing a rowline to those cells; as well as for selection of the memory cells directly underlying line 12c including memory element 14b and selection device 16b, providing a column line to those cells.

Stacking of thin film memory devices and shared addressing lines are known and described in published patent application 2006/0120136 entitled, "SHARED ADDRESSE LINES FOR CROSSPOINT MEMORY," and in U.S. Pat. No. 6,795,338, entitled "Memory Having Access Devices Using Phase Change Material Such As Chalcogenide," which are hereby incorporated by reference.

The formation of each layer, such as metal layer N, typically requires several process steps. Such process steps may include: deposition, lithography, etching, cleaning, dielectric deposition, and planarization, for example. Conventional memories, which rely upon single-crystal circuitry to perform memory access functions such as address-decoding, have had to rely upon dramatically increased numbers of mask steps (along with ancillary steps just described) in order to achieve greater memory densities. A conventional single-crystal memory of 128 Mbit or more requires at least thirty mask steps. Each additional mask step adds significantly to the cost of production, limits production flexibility, decreases reliability, increases production cycletimes, and increases inventory costs. Because all access devices and access circuitry, such as address decoding circuitry, is contiguous with the substrate in a single-crystal memory device, additional metal layers (and associated mask and ancillary steps) may be required to route address and data lines to memory cells. As features sizes shrink, conventional single-crystal circuitry, including memory devices and peripheral memory circuitry must include isolation features, such as implant regions. Such isolation regions require additional process steps including: mask, trench etch, clean, implant, clean, dielectric fill, and planarization.

Memory cells in a standalone all-thin-film memory in accordance with the principles of the present invention are self-isolating (being surrounded, for example, by insulator material such as SiO2) and, therefore, avoid the additional process steps required of conventional single-crystal memory and hybrid memories that employ single-crystal circuits, such as decoders and select devices, in combination with thin film memory cells. By eliminating conventional single-crystal devices a standalone thin film memory in accordance with the principles of the present invention eliminates the multiple mask steps associated with the formation of n-channel MOSFETs, with the formation of p-channel MOSFETS, with the isolation of n-channel MOSFETS, with the isolation of P-channel MOSFETS, and with the interconnection to these devices. Additionally, by off-loading a substantial amount of memory support functions to a controller, the complexity of a standalone thin film memory in accordance with the principles of the present invention may be substantially less than a conventional memory of the same capacity.

In an illustrative embodiment, a standalone thin film memory in accordance with the principles of the present invention includes only a thin film memory array, thin film access devices, thin film decoding, and thin film drivers for input/output operations; all other functions are executed by a controller adapted to controlling one or more standalone thin film memories in accordance with the principles of the present invention. By eliminating the complexity associated with a memory that includes peripheral support circuits, along with a memory array and access circuits, a standalone thin film memory in accordance with the principles of the present invention avoids the use of additional metal layers (for example, three to five metal layers, each requiring two to four mask steps) often required to interconnect conventional, complex, single-crystal memories.

Even hybrid thin-film/single-crystal memories, which employ a single-crystal substrate that includes single-crystal circuitry such as address-decoding circuitry, may be forced to use more mask steps in order to route address and data lines to memory cells.

A standalone all-thin-film memory in accordance with the principles of the present invention greatly reduces the number of mask steps required for each complete memory layer of 128 Mbit or more. In some embodiments, an all-thin-film memory in accordance with the principles of the present invention may reduce the number of mask steps required for the formation of a complete memory layer of 128 Mbit or more to a range of between eight and twenty mask steps. By sharing interconnect layers, as in the stacked embodiment of FIG. 15, the number of layer, and associated mask steps per layer of memory, can be reduced even further.

Figure 16:
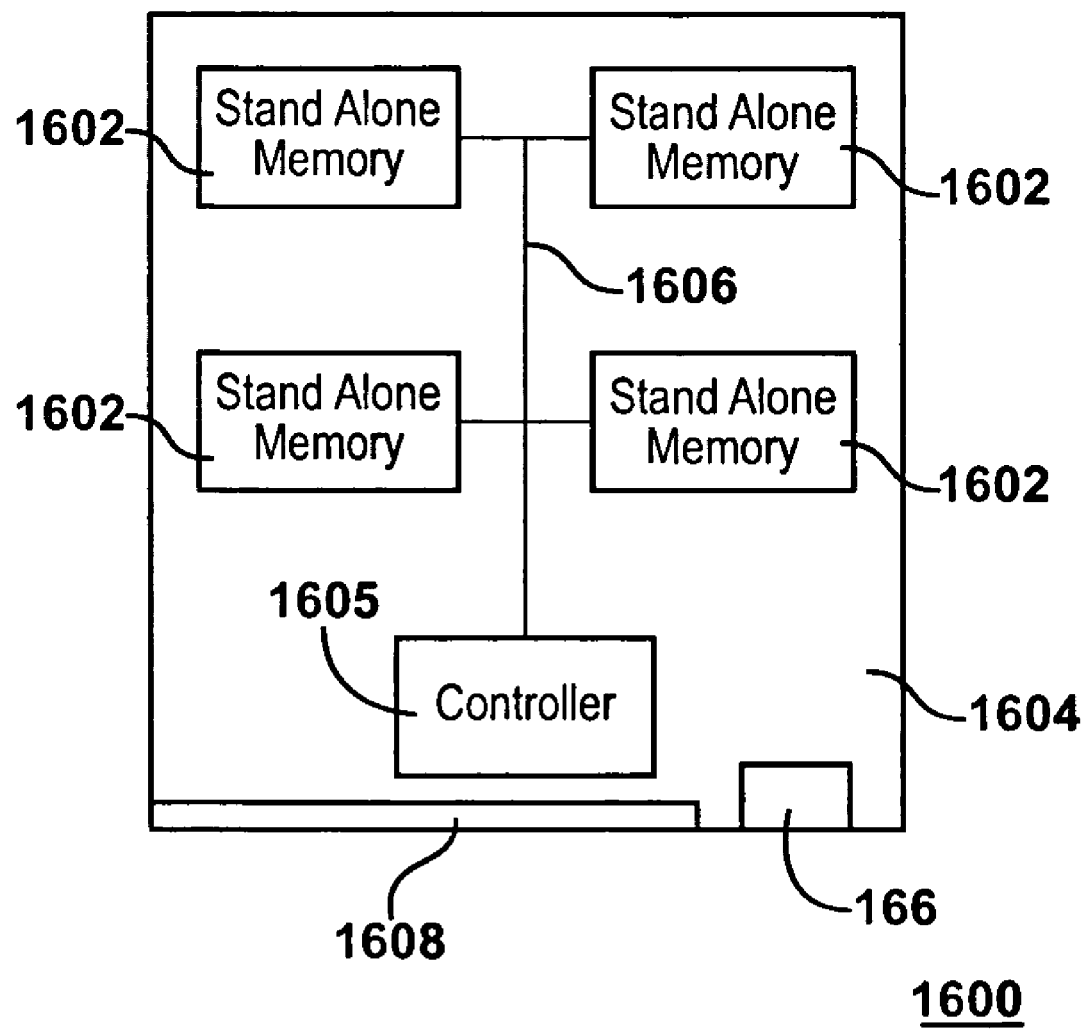
FIG. 16 is a top plan view of a standalone thin film memory system formed on a glass substrate.

In the illustrative embodiment, in FIG. 16 a memory system 1600 in accordance with the principles of the present invention includes one or more standalone thin film memories 1602 deposited on a non-crystalline substrate 1604. Such a non-crystalline substrate 1604 may be a surface mount PC board, for example. A plurality of standalone memory devices 1602 in accordance with the principles of the present invention may be joined via interconnecting conductive lines 1606 patterned on the substrate. Conductive interconnecting lines may be patterned in a multilayer substrate, in order to connect components through conductive lines situated on different layers of the substrate, for example.

A memory controller 1605 may be formed on the same substrate 1604 and configured to operate the standalone memories 1602 in a manner previously described. The memory controller 1605 may itself be a thin-film component implemented using thin film logic such as the 3T OTS logic described in the discussion related to FIGS. 7-14. Alternatively, the memory controller may be formed in separate processes, such as a conventional CMOS process, then connected to the standalone memories formed on the non-crystalline substrate through processes such as those employed in hybrid circuit manufacture, for example. The memory system 1600 may communicate with other components using conventional interconnection components, such as edge connector 1608 or other self-contained connector 1610 which may be a high speed optical or coaxial connector, for example.

The thin film electronic device(s) described in the discussion related to the previous figures may be employed to particular advantage in a wide variety of systems. The schematic diagram of FIG. 17 will be discussed to illustrate the devices' use in a few such systems. The schematic diagram of FIG. 17 includes many components and devices, some of which may be used for specific embodiments of a system in accordance with the principles of the present invention and while others not used. In other embodiments, other similar systems, components and devices may be employed. In general, the system includes logic circuitry configured to operate along with standalone thin film memory which may include phase change memory. The logic circuitry may be discrete, programmable, application-specific, or in the form of a microprocessor, microcontroller, or digital signal processor, for example. In some embodiments, the logic circuitry may be implemented using thin film logic. And the embodiments herein may also be employed on integrated chips or connected to such circuitry. The exemplary system of FIG. 17 is for descriptive purposes only. Although the description may refer to terms commonly used in describing particular computer, communications, tracking, and entertainment systems; the description and concepts equally apply to other systems, including systems having architectures dissimilar to that illustrated in FIG. 17. The electronic system 1700, in various embodiments, may be implemented as, for example, a general purpose computer, a router, a large-scale data storage system, a portable computer, a personal digital assistant, a cellular telephone, an electronic entertainment device, such as a music or video playback device or electronic game, a microprocessor, a microcontroller, a digital signal processor, or a radio frequency identification device. Any or all of the components depicted in FIG. 17 may employ a standalone thin film memory or a chalcogenide electronic device, such as a chalcogenide-based nonvolatile memory and/or threshold switch, for example.

In an illustrative embodiment, the system 1700 may include a central processing unit (CPU) 1705, which may be implemented with some or all of a microprocessor, a random access memory (RAM) 1710 for temporary storage of information, and a read only memory (ROM) 1715 for permanent storage of information. A memory controller 1720 is provided for controlling RAM 1710. In accordance with the principles of the present invention, all of, or any portion of, any of the memory elements (e.g. RAM or ROM) may be implemented as a standalone thin film memory which may include chalcogenide-based nonvolatile memory. An electronic system 1700 in accordance with the principles of the present invention may be a microprocessor that operates as a CPU 1705, in combination with embedded chalcogenide-based electronic nonvolatile memory that operates as RAM 1710 and/or ROM 1715, or as a portion thereof. In this illustrative example, the microprocessor/chalcogenide-nonvolatile memory combination may be standalone, or may operate with other components, such as those of FIG. 17 yet-to-be described.

In implementations within the scope of the invention, a bus 1730 interconnects the components of the system 1700. A bus controller 1725 is provided for controlling bus 1730. An interrupt controller 1735 may or may not be used for receiving and processing various interrupt signals from the system components. Such components as the bus 1730, bus controller 1725, and interrupt controller 1735 may be employed in a large-scale implementation of a system in accordance with the principles of the present invention, such as that of a standalone computer, a router, a portable computer, or a data storage system, for example.

Mass storage may be provided by diskette 1742, CD ROM 1747, or hard drive 1752. Data and software may be exchanged with the system 1700 via removable media such as diskette 1742 and CD ROM 1747. Diskette 1742 is insertable into diskette drive 1741 which is, in turn, connected to bus 1730 by a controller 1740. Similarly, CD ROM 1747 is insertable into CD ROM drive 1746 which is, in turn, connected to bus 1730 by controller 1745. Hard disc 1752 is part of a fixed disc drive 1751 which is connected to bus 1730 by controller 1750. Although conventional terms for storage devices (e.g., diskette) are being employed in this description of a system in accordance with the principles of the present invention, any or all of the storage devices may be implemented using standalone thin film memory which may include chalcogenide-based nonvolatile memory in accordance with the principles of the present invention. Removable storage may be provided by a nonvolatile storage component, such as a thumb drive, that employs a chalcogenide-based nonvolatile memory in accordance with the principles of the present invention as the storage medium. Storage systems that employ chalcogenide-based nonvolatile memory as "plug and play" substitutes for conventional removable memory, such as disks or CD ROMs or thumb drives, for example, may emulate existing controllers to provide a transparent interface for controllers such as controllers 1740, 1745, and 1750, for example.

User input to the system 1700 may be provided by any of a number of devices. For example, a keyboard 1756 and mouse 1757 are connected to bus 1730 by controller 1755. An audio transducer 1796, which may act as both a microphone and/or a speaker, is connected to bus 1730 by audio controller 1797, as illustrated. Other input devices, such as a pen and/or tabloid may be connected to bus 1730 and an appropriate controller and software, as required, for use as input devices. DMA controller 1760 is provided for performing direct memory access to RAM 1710, which, as previously described, may be implemented in whole or part using chalcogenide-based nonvolatile memory devices in accordance with the principles of the present invention. A visual display is generated by video controller 1765 which controls display 1770. The display 1770 may be of any size or technology appropriate for a given application.

In a cellular telephone or portable entertainment system embodiment, for example, the display 1770 may include one or more relatively small (e.g. on the order of a few inches per side) LCD displays. In a large-scale data storage system, the display may be implemented as large-scale multi-screen, liquid crystal displays (LCDs), or organic light emitting diodes (OLEDs), including quantum dot OLEDs, for example.

The system 1700 may also include a communications adaptor 1790 which allows the system to be interconnected to a local area network (LAN) or a wide area network (WAN), schematically illustrated by bus 1791 and network 1795. An input interface 1799 operates in conjunction with an input device 1793 to permit a user to send information, whether command and control, data, or other types of information, to the system 1700. The input device and interface may be any of a number of common interface devices, such as a joystick, a touch-pad, a touch-screen, a speech-recognition device, or other known input device. In some embodiments of a system in accordance with the principles of the present invention, the adapter 1790 may operate with transceiver 1773 and antenna 1775 to provide wireless communications, for example, in cellular telephone, RFID, and wifi computer implementations.

Operation of system 1700 is generally controlled and coordinated by operating system software. The operating system controls allocation of system resources and performs tasks such as processing scheduling, memory management, networking, and I/O services, among other things. In particular, an operating system resident in system memory and running on CPU 1705 coordinates the operation of the other elements of the system 1700.

In illustrative handheld electronic device embodiments of a system 1700 in accordance with the principles of the present invention, such as a cellular telephone, a personal digital assistance, a digital organizer, a laptop computer, a handheld information device, a handheld entertainment device such as a device that plays music and/or video, small-scale input devices, such as keypads, function keys and soft keys, such as are known in the art, may be substituted for the controller 1755, keyboard 1756 and mouse 1757, for example. Embodiments with a transmitter, recording capability, etc., may also include a microphone input (not shown).

In an illustrative RFID transponder implementation of a system 1700 in accordance with the principles of the present invention, the antenna 1775 may be configured to intercept an interrogation signal from a base station at a frequency $F_1$. The intercepted interrogation signal would then be conducted to a tuning circuit (not shown) that accepts signal $F_1$ and rejects all others. The signal then passes to the transceiver 1773 where the modulations of the carrier $F_1$ comprising the interrogation signal are detected, amplified and shaped in known fashion. The detected interrogation signal then passes to a decoder and logic circuit which may be implemented as discrete logic in a low power application, for example, or as a microprocessor/memory combination as previously described. The interrogation signal modulations may define a code to either read data out from or write data into a chalcogenide-based nonvolatile memory in accordance with the principles of the present invention. In this illustrative embodiment, data read out from the memory is transferred to the transceiver 1773 as an "answerback" signal on the antenna 1775 at a second carrier frequency $F_2$. In passive RFID systems, power is derived from the interrogating signal and memory such as provided by a chalcogenide-based nonvolatile memory in accordance with the principles of the present invention is particularly well suited to such use.

I claim:

1. An apparatus, comprising:
   a first three terminal thin film ovonic threshold switching device; and
   a second three terminal thin film ovonic threshold switching device, wherein said first and second switching devices are coupled together and configured to perform a logic function.

2. The apparatus of claim 1 wherein the three-terminal thin film ovonic threshold switching devices are asymmetric threshold devices.

3. The apparatus of claim 2 further comprising third and fourth three terminal thin film switching devices, wherein said switching devices are configured as at least one logic gate selected from the group consisting of AND, OR, NOT, NAND, NOR, XOR, and XNOR.

4. The apparatus of claim 2 further comprising a plurality of complementary logic gates configured as a decoder.

5. The apparatus of claim 2 further comprising a plurality of complementary logic gates configured to employ a multi-phase clock.

6. The apparatus of claim 2 further comprising a plurality of complementary logic gates configured as a latch.

7. The apparatus of claim 6 wherein the complementary logic gates are configured to employ a multi-phase clock.

8. The apparatus of claim 2 further comprising a plurality of complementary logic gates configured as a memory controller.

9. The apparatus of claim 8 wherein the complementary logic gates are configured to employ a multi-phase clock.

10. The apparatus of claim 2 further comprising a plurality of complementary logic gates configured as a microprocessor.

11. The apparatus of claim 10 wherein the complementary logic gates are configured to employ a multi-phase clock.

12. An electronic device, comprising:
    a logic circuit, including:
      a first three terminal thin film ovonic threshold switching device; and
      a second three terminal thin film ovonic threshold switching device;
      wherein said first and second switching devices are coupled together and configured to perform a logic function; and
    a memory array, wherein the logic circuit is configured to interface with the memory array.

13. The electronic device of claim 12 wherein the logic circuit comprises a decoder.

14. The apparatus of claim 12 wherein the logic circuit includes asymmetric-threshold three terminal electronic switching devices.

15. The apparatus of claim 14 wherein the electronic device comprises is a multi-phase clock circuit.

16. The electronic device of claim 14 wherein the logic circuit comprises a latch.

17. The apparatus of claim 16 wherein the logic circuit is a multi-phase clock circuit.

18. The electronic device of claim 12 further comprising a microprocessor configured to interface with the logic circuit.

19. The apparatus of claim 18 wherein the logic circuit includes asymmetric-threshold three terminal electronic switching devices.

20. The apparatus of claim 18 wherein the logic circuit is a multi-phase clock circuit.

21. The electronic device of claim 18 further comprising a transmitter/receiver configured to transmit data from and receive data for the microprocessor or memory.

22. The apparatus of claim 21 wherein the logic circuit includes asymmetric-threshold three terminal electronic switching devices.

23. The apparatus of claim 21 wherein the electronic device comprises is a multi-phase clock circuit.

24. The electronic device of claim 22 wherein the memory, microprocessor and transmitter/receiver are configured as a cellular telephone.

25. The electronic device of claim 18 wherein the memory and microprocessor are configured as a handheld entertainment device.

26. The apparatus of claim 25 wherein the logic circuit includes asymmetric-threshold three terminal electronic switching devices.

27. The apparatus of claim 25 wherein the logic circuit is a multi-phase clock circuit.

28. The electronic device of claim 18 wherein the memory and microprocessor are configured as a solid state drive.

29. The apparatus of claim 28 wherein the logic circuit includes asymmetric-threshold three terminal electronic switching devices.

30. The apparatus of claim 28 wherein the logic circuit is a multi-phase clock circuit.

* * * * *